(12) United States Patent
Kim

(10) Patent No.: US 10,847,206 B2
(45) Date of Patent: Nov. 24, 2020

(54) SEMICONDUCTOR DEVICES FOR EXECUTING A COLUMN OPERATION

(71) Applicant: SK hynix Inc., Icheon-si (KR)

(72) Inventor: Woongrae Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/284,971

(22) Filed: Feb. 25, 2019

(65) Prior Publication Data

US 2020/0105334 A1 Apr. 2, 2020

(30) Foreign Application Priority Data

Oct. 1, 2018 (KR) .................. 10-2018-0117097

(51) Int. Cl.
*G11C 11/408* (2006.01)
*G11C 11/4096* (2006.01)

(52) U.S. Cl.
CPC ...... *G11C 11/4082* (2013.01); *G11C 11/4096* (2013.01)

(58) Field of Classification Search
CPC ............ G11C 11/4082; G11C 11/4096; G11C 7/1045; G11C 7/1039
See application file for complete search history.

(56) References Cited

U.S. PATENT DOCUMENTS

| 2013/0182515 A1* | 7/2013 | Lin ............................ G06F 5/10 365/189.15 |
| 2015/0310904 A1 | 10/2015 | Kim et al. |
| 2017/0153974 A1* | 6/2017 | Jin ............................ G11C 8/06 |

FOREIGN PATENT DOCUMENTS

KR 1020100030510 A 3/2010

\* cited by examiner

*Primary Examiner* — David Lam
(74) *Attorney, Agent, or Firm* — William Park & Associates Ltd.

(57) ABSTRACT

A semiconductor device includes a shifted write signal generation circuit, a shifted address generation circuit and a bank address latch circuit. The shifted write signal generation circuit is configured to shift a write signal based on a mode signal to generate a shifted write signal. The shifted address generation circuit is configured to shift an internal address based on the mode signal to generate a shifted internal address. The bank address latch circuit is configured to latch and store the internal address based on the write signal, configured to latch and store the shifted internal address based on the shifted write signal, and configured to generate a write bank address from the stored internal address and the stored address of the shifted internal address.

20 Claims, 16 Drawing Sheets

SEMICONDUCTOR DEVICES FOR EXECUTING A COLUMN OPERATION

CROSS-REFERENCE TO RELATED APPLICATIONS

The present application claims priority under 35 U.S.C 119(a) to Korean Application No. 10-2018-0117097, filed on Oct. 1, 2018, which is incorporated herein by reference in its entirety.

BACKGROUND

1. Technical Field

Embodiments of the present disclosure generally relate to semiconductor devices related to a column operation.

2. Related Art

In general, each of semiconductor devices such as dynamic random access memory (DRAM) devices may include a plurality of bank groups comprised of cell arrays which are selected by addresses. Each of the bank groups may be realized to include a plurality of banks. The semiconductor device may select any one of the plurality of bank groups and may perform a column operation for outputting data stored in a cell array included in the selected bank group through input/output (I/O) lines.

SUMMARY

According to an embodiment, a semiconductor device may include a shifted write signal generation circuit, a shifted address generation circuit and a bank address latch circuit. The shifted write signal generation circuit may be configured to shift a write signal based on a mode signal to generate a shifted write signal. The shifted address generation circuit may be configured to shift an internal address based on the mode signal to generate a shifted internal address. The bank address latch circuit may be configured to latch and store the internal address based on the write signal, configured to latch and store the shifted internal address based on the shifted write signal, and may be configured to generate a write bank address from the stored internal address and the stored address of the shifted internal address.

According to an embodiment, a semiconductor device may include a shifted read signal generation circuit, a shifted address generation circuit and a bank address latch circuit. The shifted read signal generation circuit may be configured to shift a read signal based on a mode signal to generate a shifted read signal. The shifted address generation circuit may be configured to shift an internal address based on the mode signal to generate a shifted internal address. The bank address latch circuit may be configured to latch and store the internal address based on the read signal, configured to latch and store the shifted internal address based on the shifted read signal, and configured to generate a read bank address from the stored internal address and the stored address of the shifted internal address.

According to an embodiment, a semiconductor device includes a first internal address latch, a second internal address latch and a pipe latch. The first internal address latch may be configured to latch an internal address based on a write signal. The second internal address latch may be configured to latch a shifted internal address based on a shifted write signal. The pipe latch may be configured to store the internal address, which may be latched by the first internal address latch, based on a write input control signal, configured to store the shifted internal address, which may be latched by the second internal address latch, based on the write input control signal, configured to output the stored internal address based on a write output control signal for generation of a write bank address, and configured to output the stored address of the shifted internal address based on the write output control signal for generation of the write bank address.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Semiconductor devices including a plurality of banks may provide various bank modes such as a bank group mode, an 8-bank mode and a 16-bank mode. The plurality of banks may constitute a bank group. For example, four banks may constitute one bank group. In the bank group mode, a column operation for one bank included in the bank group may be performed by one command before and after a bubble period. In the 8-bank mode, column operations for two banks respectively included in two separate bank groups may be sequentially performed by one command. In the 16-bank mode, column operations for four banks respectively included in four separate bank groups may be sequentially performed by one command.

Figure 1:
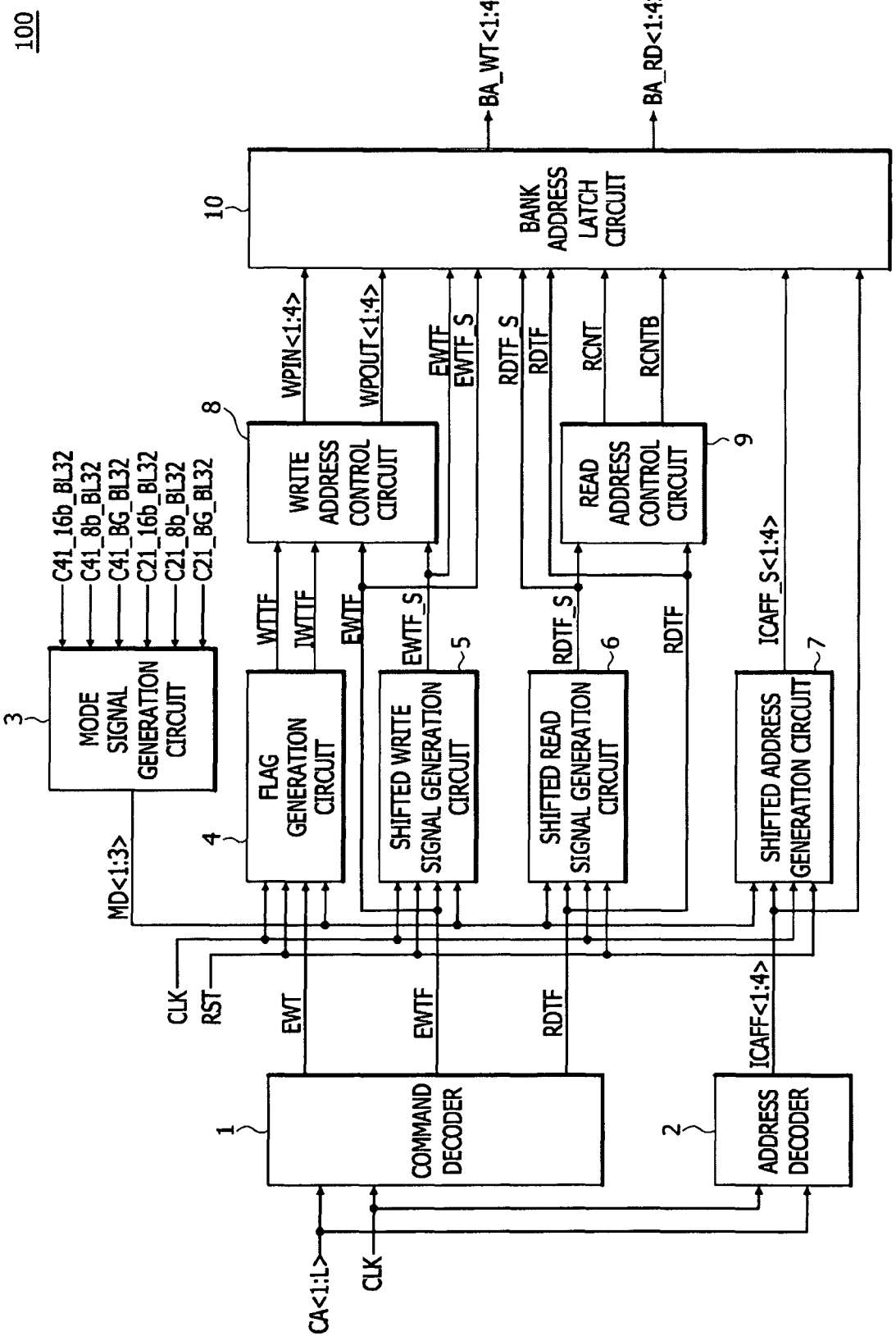
FIG. 1 is a block diagram illustrating a configuration of a semiconductor device according to an embodiment of the present disclosure.

As illustrated in FIG. 1, a semiconductor device 100 according to an embodiment may include a command decoder 1, an address decoder 2, a mode signal generation circuit 3, a flag generation circuit 4, a shifted write signal generation circuit 5, a shifted read signal generation circuit 6, a shifted address generation circuit 7, a write address control circuit 8, a read address control circuit 9 and a bank address latch circuit 10.

The command decoder 1 may generate a first write signal EWT, a second write signal EWTF and a read signal RDTF based on first to $L^{th}$ command/address signals CA<1:L> and a clock signal CLK. The first to $L^{th}$ command/address signals CA<1:L> may include a command and an address which are provided by an eternal device. The number "L" of bits included in the first to $L^{th}$ command/address signals CA<1:L> may be set to be different according to the embodiments.

The command decoder 1 may decode the command included in the first to $L^{th}$ command/address signals CA<1:L> to generate the first write signal EWT and the second write signal EWTF. The first write signal EWT may be generated in synchronization with a point of time (hereinafter, referred to as a rising edge) that a level transition of the clock signal CLK occurs from a logic "low" level into a logic "high" level, and the second write signal EWTF may be generated in synchronization with a point of time (hereinafter, referred to as a falling edge) that a level transition of the clock signal CLK occurs from a logic "high" level into a logic "low" level. The points of time that the first and second write signals EWT and EWTF are generated may be set to be different according to the embodiments. In some embodiments, the first and second write signals EWT and EWTF may be set to be generated at the same point of time. A logic level combination of the first to $L^{th}$ command/address signals CA<1:L> for generating the first write signal EWT and a logic level combination of the first to $L^{th}$ command/address signals CA<1:L> for generating the second write signal EWTF may be set to be different according to the embodiments.

The command decoder 1 may decode the command included in the first to $L^{th}$ command/address signals CA<1:L> to generate the read signal RDTF. The read signal RDTF may be generated in synchronization with a falling edge of the clock signal CLK. A point of time that the read signal RDTF is generated may be set to be different according to the embodiments. A logic level combination of the first to $L^{th}$ command/address signals CA<1:L> for generating the read signal RDTF may be set to be different according to the embodiments.

The address decoder 2 may decode the address included in the first to $L^{th}$ command/address signals CA<1:L> to generate an internal address ICAFF<1:4>. The internal address ICAFF<1:4> may be generated in synchronization with a falling edge of the clock signal CLK. A point of time that the internal address ICAFF<1:4> is generated may be set to be different according to the embodiments. A logic level combination of the first to $L^{th}$ command/address signals CA<1:L> for generating the internal address ICAFF<1:4> may be set to be different according to the embodiments.

The mode signal generation circuit 3 may generate first to third mode signals MD<1:3> based on a first state information C41_16b_BL32, a second state information C41_8b_BL32, a third state information C41_BG_BL32, a fourth state information C21_16b_BL32, a fifth state information C21_8b_BL32 and a sixth state information C21_BG_BL32. The mode signal generation circuit 3 may selectively generate one of the first to third mode signals MD<1:3> based on a ratio of a frequency of a data clock signal (WCK of FIG. 16) to a frequency of the clock signal CLK as well as information on a bank mode and a burst length which are employed in a column operation. The data clock signal WCK may be an internal clock signal used for input/output (I/O) of data and may be generated from the clock signal CLK. If a ratio of a frequency of the data clock signal WCK to a frequency of the clock signal CLK is "K", it means that a frequency of the data clock signal WCLK is set to be "K" times a frequency of the clock signal CLK. The bank mode employed in the column operation may be set as one of the bank group mode, the 8-bank mode and the 16-bank mode. The information on the burst length may include the number of bits of data which are sequentially inputted to or outputted from the semiconductor device 100 by one command. For example, if the burst length is set to be thirty-two, 32-bit data may be sequentially inputted or outputted from the semiconductor device 100 by one command.

The mode signal generation circuit 3 may generate the first mode signal MD<1> among the first to third mode signals MD<1:3> if the first state information C41_16b_BL32 or the second state information C41_8b_BL32 is generated. The first state information C41_16b_BL32 may be generated while a ratio of a frequency of the data clock signal WCK to a frequency of the clock signal CLK is set as four, the column operation is performed in the 16-bank mode, and the burst length is set to be thirty-two. The second state information C41_8b_BL32 may be generated while a ratio of a frequency of the data clock signal WCK to a frequency of the clock signal CLK is set as four, the column operation is performed in the 8-bank mode, and the burst length is set to be thirty-two. Logic levels of the first state information C41_16b_BL32, the second state information C41_8b_BL32 and the first mode signal MD<1> may be set to be different according to the embodiments.

The mode signal generation circuit 3 may generate the second mode signal MD<2> among the first to third mode signals MD<1:3> if any one of the third state information C41_BG_BL32, the fourth state information C21_16b_BL32 and the fifth state information C21_8b_BL32 is generated. The third state information C41_BG_BL32 may be generated while a ratio of a frequency of the data clock signal WCK to a frequency of the clock signal CLK is set as four, the column operation is performed in the bank group mode, and the burst length is set to be thirty-two. The fourth state information C21_16b_BL32 may be generated while a ratio of a frequency of the data clock signal WCK to a frequency of the clock signal CLK is set as two, the column operation is performed in the 16-bank mode, and the burst length is set to be thirty-two. The fifth state information C21_8b_BL32 may be generated while a ratio of a frequency of the data clock signal WCK to a frequency of the clock signal CLK is set as two, the column operation is performed in the 8-bank mode, and the burst length is set to be thirty-two. Logic levels of the third state information C41_BG_BL32, the fourth state information C21_16b_BL32, the fifth state information C21_8b_BL32 and the second mode signal MD<2> may be set to be different according to the embodiments.

The mode signal generation circuit 3 may generate the third mode signal MD<3> among the first to third mode signals MD<1:3> if the sixth state information C21_BG_BL32 is generated. The sixth state information C21_BG_BL32 may be generated while a ratio of a frequency of the data clock signal WCK to a frequency of the clock signal CLK is set as two, the column operation is performed in the bank group mode, and the burst length is set to be thirty-two. Logic levels of the sixth state information C21_BG_BL32 and the third mode signal MD<3> may be set to be different according to the embodiments. A configuration and an operation of the mode signal generation circuit 3 will be described more fully with reference to FIG. 2 later.

The flag generation circuit 4 may generate a write flag WTTF and an internal write flag IWTTF from the first write signal EWT based on the first to third mode signals MD<1: 3>, the clock signal CLK and a reset signal RST. The flag generation circuit 4 may initialize the write flag WTTF and the internal write flag IWTTF if the reset signal RST is generated. The reset signal RST may be generated to perform an initialization operation. The flag generation circuit 4 may delay the first write signal EWT by a latency period set by a write latency to generate the write flag WTTF. The latency period corresponding to a delay time of the first write signal EWT in the flag generation circuit 4 may be set to be different according to the embodiments. The flag generation circuit 4 may shift the write flag WTTF in synchronization with the clock signal CLK according to any one generated among the first to third mode signals MD<1:3> to generate the internal write flag IWTTF. The flag generation circuit 4 may shift the write flag WTTF by a period, which is set to perform the column operation according to the burst length, to generate the internal write flag IWTTF.

The flag generation circuit 4 may shift the write flag WTTF by two cycles of the clock signal CLK to generate the internal write flag IWTTF if the first mode signal MD<1> is generated. If the first mode signal MD<1> is generated, a period set to perform the column operation according to the burst length may be set as two cycles of the clock signal CLK. The flag generation circuit 4 may shift the write flag WTTF by four cycles of the clock signal CLK to generate the internal write flag IWTTF if the second mode signal MD<2> is generated. If the second mode signal MD<2> is generated, a period set to perform the column operation according to the burst length may be set as four cycles of the clock signal CLK. The flag generation circuit 4 may shift the write flag WTTF by eight cycles of the clock signal CLK to generate the internal write flag IWTTF if the third mode signal MD<3> is generated. If the third mode signal MD<3> is generated, a period set to perform the column operation according to the burst length may be set as eight cycles of the clock signal CLK. A configuration and an operation of the flag generation circuit 4 will be described more fully with reference to FIGS. 3 to 6 later.

The shifted write signal generation circuit 5 may generate a shifted write signal EWTF_S from the second write signal EWTF based on the first to third mode signal MD<1:3>, the clock signal CLK and the reset signal RST. The shifted write signal generation circuit 5 may initialize the shifted write signal EWTF_S if the reset signal RST is generated. The shifted write signal generation circuit 5 may shift the second write signal EWTF in synchronization with the clock signal CLK according to any one generated among the first to third mode signals MD<1:3> to generate the shifted write signal EWTF_S.

The shifted write signal generation circuit 5 may shift the second write signal EWTF by two cycles of the clock signal CLK to generate the shifted write signal EWTF_S if the first mode signal MD<1> is generated. The shifted write signal generation circuit 5 may shift the second write signal EWTF by four cycles of the clock signal CLK to generate the shifted write signal EWTF_S if the second mode signal MD<2> is generated. The shifted write signal generation circuit 5 may shift the second write signal EWTF by eight cycles of the clock signal CLK to generate the shifted write signal EWTF_S if the third mode signal MD<3> is generated. A configuration and an operation of the shifted write signal generation circuit 5 will be described more fully with reference to FIG. 7 later.

The shifted read signal generation circuit 6 may generate a shifted read signal RDTF_S from the read signal RDTF based on the first to third mode signal MD<1:3>, the clock signal CLK and the reset signal RST. The shifted read signal generation circuit 6 may initialize the shifted read signal RDTF_S if the reset signal RST is generated. The shifted read signal generation circuit 6 may shift the read signal RDTF in synchronization with the clock signal CLK according to any one generated among the first to third mode signals MD<1:3> to generate the shifted read signal RDTF_S.

The shifted read signal generation circuit 6 may shift the read signal RDTF by two cycles of the clock signal CLK to generate the shifted read signal RDTF_S if the first mode signal MD<1> is generated. The shifted read signal generation circuit 6 may shift the read signal RDTF by four cycles of the clock signal CLK to generate the shifted read signal RDTF_S if the second mode signal MD<2> is generated. The shifted read signal generation circuit 6 may shift the read signal RDTF by eight cycles of the clock signal CLK to generate the shifted read signal RDTF_S if the third mode signal MD<3> is generated. A configuration and an operation of the shifted read signal generation circuit 6 will be described more fully with reference to FIG. 8 later.

The shifted address generation circuit 7 may generate a shifted internal address ICAFF_S<1:4> from the internal address ICAFF<1:4> based on the first to third mode signal MD<1:3>, the clock signal CLK and the reset signal RST. The shifted address generation circuit 7 may initialize the shifted internal address ICAFF_S<1:4> if the reset signal RST is generated. The shifted address generation circuit 7 may shift the internal address ICAFF<1:4> in synchronization with the clock signal CLK according to any one generated among the first to third mode signals MD<1:3> to generate the shifted internal address ICAFF_S<1:4>.

The shifted address generation circuit 7 may shift the internal address ICAFF<1:4> by two cycles of the clock signal CLK to generate the shifted internal address ICAFF_S<1:4> if the first mode signal MD<1> is generated. The shifted address generation circuit 7 may shift the internal address ICAFF<1:4> by four cycles of the clock signal CLK to generate the shifted internal address ICAFF_S<1:4> if the second mode signal MD<2> is generated. The shifted address generation circuit 7 may shift the internal address ICAFF<1:4> by eight cycles of the clock signal CLK to generate the shifted internal address ICAFF_S<1:4> if the third mode signal MD<3> is generated. A configuration and an operation of the shifted address generation circuit 7 will be described more fully with reference to FIG. 9 later.

The write address control circuit 8 may generate first to fourth write input control signals WPIN<1:4> and first to fourth write output control signals WPOUT<1:4> based on the second write signal EWTF, the shifted write signal EWTF_S, the write flag WTTF and the internal write flag IWTTF. The write address control circuit 8 may sequentially generate the first to fourth write input control signals WPIN<1:4> if the second write signal EWTF or the shifted write signal EWTF_S is generated. The write address control circuit 8 may sequentially generate the first to fourth write output control signals WPOUT<1:4> if the write flag WTTF or the internal write flag IWTTF is generated.

The write address control circuit 8 may generate the first write input control signal WPIN<1> if the second write signal EWTF or the shifted write signal EWTF_S is generated a first time, may generate the second write input control signal WPIN<2> if the second write signal EWTF or the shifted write signal EWTF_S is generated a second time, may generate the third write input control signal WPIN<3> if the second write signal EWTF or the shifted write signal EWTF_S is generated a third time, and may generate the fourth write input control signal WPIN<4> if the second write signal EWTF or the shifted write signal EWTF_S is generated a fourth time.

The write address control circuit 8 may generate the first write output control signal WPOUT<1> if the write flag WTTF or the internal write flag IWTTF is generated a first time, may generate the second write output control signal WPOUT<2> if the write flag WTTF or the internal write flag IWTTF is generated a second time, may generate the third write output control signal WPOUT<3> if the write flag WTTF or the internal write flag IWTTF is generated a third time, and may generate the fourth write output control signal WPOUT<4> if the write flag WTTF or the internal write flag IWTTF is generated a fourth time. A configuration and an operation of the write address control circuit 8 will be described more fully with reference to FIG. 10 later.

The read address control circuit 9 may generate a read control signal RCNT and an inverted read control signal RCNTB if the read signal RDTF or the shifted read signal RDTF_S is generated. The read control signal RCNT may be generated at a point of time that a predetermined read delay period elapses from a point of time that the read signal RDTF or the shifted read signal RDTF_S is generated. The inverted read control signal RCNTB may be generated to have an opposite logic level to the read control signal RCNT. A configuration and an operation of the read address control circuit 9 will be described more fully with reference to FIG. 11 later.

The bank address latch circuit 10 may generate a write bank address BA_WT<1:4> and a read bank address BA_RD<1:4> from the internal address ICAFF<1:4> and the shifted internal address ICAFF_S<1:4> based on the first to fourth write input control signals WPIN<1:4>, the first to fourth write output control signals WPOUT<1:4>, the second write signal EWTF, the shifted write signal EWTF_S, the read signal RDTF, the shifted read signal RDTF_S, the read control signal RCNT and the inverted read control signal RCNTB.

During a write operation, the bank address latch circuit 10 may latch the internal address ICAFF<1:4> in synchronization with the second write signal EWTF, may store the latched address of the internal address ICAFF<1:4> in synchronization with the first to fourth write input control signals WPIN<1:4>, and may output the stored address of the internal address ICAFF<1:4> as the write bank address BA_WT<1:4> in synchronization with the first to fourth write output control signals WPOUT<1:4>.

During the write operation, the bank address latch circuit 10 may latch the shifted internal address ICAFF_S<1:4> in synchronization with the shifted write signal EWTF_S, may store the latched address of the shifted internal address ICAFF_S<1:4> in synchronization with the first to fourth write input control signals WPIN<1:4>, and may output the stored address of the shifted internal address ICAFF_S<1:4> as the write bank address BA_WT<1:4> in synchronization with the first to fourth write output control signals WPOUT<1:4>.

During a read operation, the bank address latch circuit 10 may latch the internal address ICAFF<1:4> in synchronization with the read signal RDTF and may output the latched address of the internal address ICAFF<1:4> as the read bank address BA_RD<1:4> in synchronization with the read control signal RCNT.

During the read operation, the bank address latch circuit 10 may latch the shifted internal address ICAFF_S<1:4> in synchronization with the shifted read signal RDTF_S and may output the latched address of the shifted internal address ICAFF_S<1:4> as the read bank address BA_RD<1:4> in synchronization with the read control signal RCNT. A configuration and an operation of the bank address latch circuit 10 will be described with reference to FIGS. 12 and 13 later.

Figure 2:
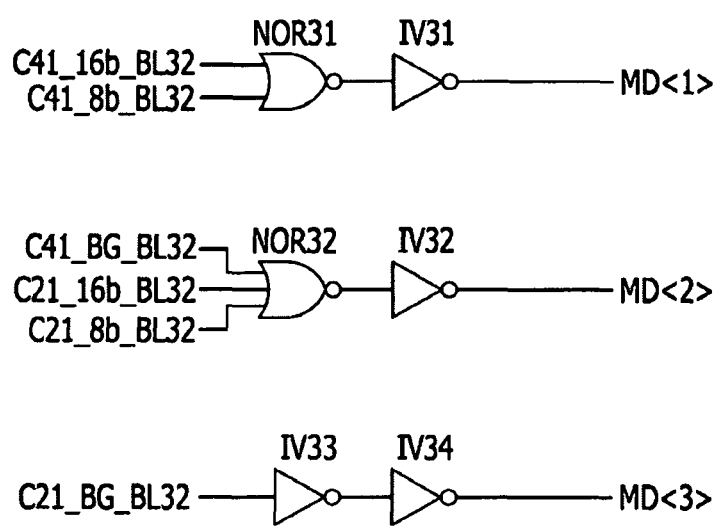
FIG. 2 is a circuit diagram illustrating an example of a mode signal generation circuit included in the semiconductor device of FIG. 1.

Referring to FIG. 2, the mode signal generation circuit 3 may be configured to perform OR and inversion operations, and may include, for example but not limited to, NOR gates NOR31 and NOR32 and inverters IV31, IV32, IV33 and IV34. The NOR gate NOR31 and the inverter IV31 may be coupled in series and may perform a logical OR operation of the first state information C41_16b_BL32 and the second state information C41_8b_BL32 to generate the first mode signal MD<1>. The NOR gate NOR32 and the inverter IV32 may be coupled in series and may perform a logical OR operation of the third state information C41_BG_BL32, the fourth state information C21_16b_BL32 and the fifth state information C21_8b_BL32 to generate the second mode signal MD<2>. The inverters IV33 and IV34 may be coupled in series and may buffer the sixth state information C21_BG_BL32 to generate the third mode signal MD<3>.

The mode signal generation circuit 3 may generate the first mode signal MD<1> if the first state information C41_16b_BL32 is generated while a ratio of a frequency of the data clock signal WCK to a frequency of the clock signal CLK is set as four, the column operation is performed in the 16-bank mode, and the burst length is set to be thirty-two. The mode signal generation circuit 3 may generate the first mode signal MD<1> if the second state information C41_8b_BL32 is generated while a ratio of a frequency of the data clock signal WCK to a frequency of the clock signal CLK is set as four, the column operation is performed in the 8-bank mode, and the burst length is set to be thirty-two. The mode signal generation circuit 3 may generate the second mode signal MD<2> if the third state information C41_BG_BL32 is generated while a ratio of a frequency of the data clock signal WCK to a frequency of the clock signal CLK is set as four, the column operation is performed in the bank group mode, and the burst length is set to be thirty-two. The mode signal generation circuit 3 may generate the second mode signal MD<2> if the fourth state information C21_16b_BL32 is generated while a ratio of a frequency of the data clock signal WCK to a frequency of the clock signal CLK is set as two, the column operation is performed in the 16-bank mode, and the burst length is set to be thirty-two. The mode signal generation circuit 3 may generate the second mode signal MD<2> if the fifth state information C21_8b_BL32 is generated while a ratio of a frequency of the data clock signal WCK to a frequency of the clock signal CLK is set as two, the column operation is performed in the 8-bank mode, and the burst length is set to be thirty-two. The mode signal generation circuit 3 may generate the third mode signal MD<3> if the sixth state information C21_BG_BL32 is generated while a ratio of a frequency of the data clock signal WCK to a frequency of the clock signal CLK is set as two, the column operation is performed in the bank group mode, and the burst length is set to be thirty-two.

Figure 3:
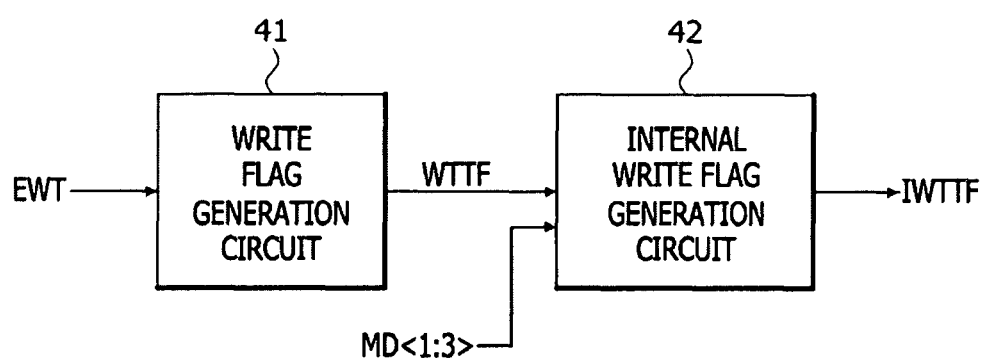
FIG. 3 is a block diagram illustrating an example of a flag generation circuit included in the semiconductor device of FIG. 1.

Referring to FIG. 3, the flag generation circuit 4 may include a write flag generation circuit 41 and an internal write flag generation circuit 42.

The write flag generation circuit 41 may generate the write flag WTTF from the first write signal EWT. The write flag generation circuit 41 may delay the first write signal EWT by the latency period set by a write latency to generate the write flag WTTF. The latency period corresponding to a delay time of the first write signal EWT in the write flag generation circuit 41 may be set to be different according to the embodiments.

The internal write flag generation circuit 42 may shift the write flag WTTF by a period, which is set to perform the column operation according to the burst length based on the first to third mode signals MD<1:3>, to generate the internal write flag IWTTF. The internal write flag generation circuit 42 may shift the write flag WTTF in synchronization with the clock signal CLK according to one generated among the first to third mode signals MD<1:3> to generate the internal write flag IWTTF. The internal write flag generation circuit 42 may shift the write flag WTTF by two cycles of the clock signal CLK to generate the internal write flag IWTTF if the first mode signal MD<1> is generated. The internal write flag generation circuit 42 may shift the write flag WTTF by four cycles of the clock signal CLK to generate the internal write flag IWTTF if the second mode signal MD<2> is generated. The internal write flag generation circuit 42 may shift the write flag WTTF by eight cycles of the clock signal CLK to generate the internal write flag IWTTF if the third mode signal MD<3> is generated.

Figure 4:
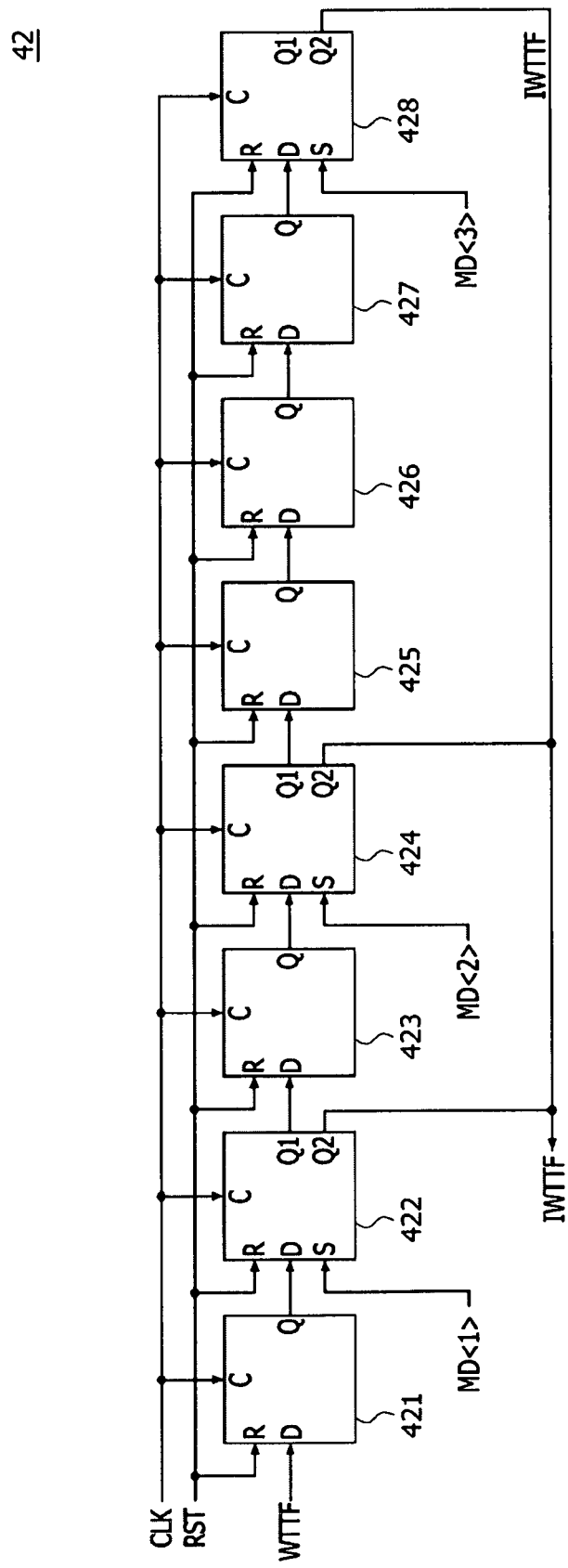
FIG. 4 is a circuit diagram illustrating an example of an internal write flag generation circuit included in the flag generation circuit of FIG. 3.

Referring to FIG. 4, the internal write flag generation circuit 42 may include a first flag latch 421, a second flag latch 422, a third flag latch 423, a fourth flag latch 424, a fifth flag latch 425, a sixth flag latch 426, a seventh flag latch 427 and an eighth flag latch 428. Each of the first to eighth flag latches 421, 422, 423, 424, 425, 426, 427 and 428 may be realized using a D-flip flop.

The first flag latch 421 may receive the reset signal RST through a reset input terminal "R" thereof and may receive the clock signal CLK through a clock input terminal "C" thereof. The first flag latch 421 may initialize a level of an output terminal "Q" thereof to a logic "low" level if the reset signal RST is generated. The first flag latch 421 may shift the write flag WTTF inputted through an input terminal "D" thereof by one cycle of the clock signal CLK to output the shifted flag of the write flag WTTF through the output terminal "Q". A configuration and an operation of the first flag latch 421 will be described with reference to FIG. 5 later.

The second flag latch 422 may receive the reset signal RST through a reset input terminal "R" thereof, may receive the clock signal CLK through a clock input terminal "C" thereof, and may receive the first mode signal MD<1> through a selection input terminal "S" thereof. The second flag latch 422 may initialize logic levels of a first output terminal "Q1" and a second output terminal "Q2" thereof to a logic "low" level if the reset signal RST is generated. The second flag latch 422 may receive an output signal of the first flag latch 421, which is outputted through the output terminal "Q" of the first flag latch 421, through an input terminal "D" thereof and may shift the output signal of the first flag latch 421 by one cycle of the clock signal CLK to output the shifted signal through the first output terminal "Q1". The second flag latch 422 may output a signal of the first output terminal "Q1" as the internal write flag IWTTF through the second output terminal "Q2" if the first mode signal MD<1> is generated. A configuration and an operation of the second flag latch 422 will be described with reference to FIG. 6 later.

The third flag latch 423 may receive the reset signal RST through a reset input terminal "R" thereof and may receive the clock signal CLK through a clock input terminal "C" thereof. The third flag latch 423 may initialize a level of an output terminal "Q" thereof to a logic "low" level if the reset signal RST is generated. The third flag latch 423 may receive an output signal of the second flag latch 422, which is outputted through the first output terminal "Q1" of the second flag latch 422, through an input terminal "D" thereof and may shift the output signal of the second flag latch 422 by one cycle of the clock signal CLK to output the shifted signal through the output terminal "Q" thereof.

The fourth flag latch 424 may receive the reset signal RST through a reset input terminal "R" thereof, may receive the clock signal CLK through a clock input terminal "C" thereof, and may receive the second mode signal MD<2> through a selection input terminal "S" thereof. The fourth flag latch 424 may initialize logic levels of a first output terminal "Q1" and a second output terminal "Q2" thereof to a logic "low" level if the reset signal RST is generated. The fourth flag latch 424 may receive an output signal of the third flag latch 423, which is outputted through the output terminal "Q" of the third flag latch 423, through an input terminal "D" thereof and may shift the output signal of the third flag latch 423 by one cycle of the clock signal CLK to output the shifted signal through the first output terminal "Q1." of the fourth flag latch 424. The fourth flag latch 424 may output a signal of the first output terminal "Q1" as the internal write flag IWTTF through the second output terminal "Q2" if the second mode signal MD<2> is generated.

The fifth flag latch 425 may receive the reset signal RST through a reset input terminal "R" thereof and may receive the clock signal CLK through a clock input terminal "C" thereof. The fifth flag latch 425 may initialize a level of an output terminal "Q" thereof to a logic "low" level if the reset signal RST is generated. The fifth flag latch 425 may receive an output signal of the fourth flag latch 424, which is outputted through the first output terminal "Q1." of the fourth flag latch 424, through an input terminal "D" thereof and may shift the output signal of the fourth flag latch 424 by one cycle of the clock signal CLK to output the shifted signal through the output terminal "Q" thereof.

The sixth flag latch 426 may receive the reset signal RST through a reset input terminal "R" thereof and may receive the clock signal CLK through a clock input terminal "C" thereof. The sixth flag latch 426 may initialize a level of an output terminal "Q" thereof to a logic "low" level if the reset signal RST is generated. The sixth flag latch 426 may receive an output signal of the fifth flag latch 425, which is outputted through the output terminal "Q" of the fifth flag latch 425, through an input terminal "D" thereof and may shift the output signal of the fifth flag latch 425 by one cycle of the clock signal CLK to output the shifted signal through the output terminal "Q" thereof.

The seventh flag latch 427 may receive the reset signal RST through a reset input terminal "R" thereof and may receive the clock signal CLK through a clock input terminal "C" thereof. The seventh flag latch 427 may initialize a level of an output terminal "Q" thereof to a logic "low" level if the reset signal RST is generated. The seventh flag latch 427 may receive an output signal of the sixth flag latch 426, which is outputted through the output terminal "Q" of the sixth flag latch 426, through an input terminal "D" thereof and may shift the output signal of the sixth flag latch 426 by one cycle of the clock signal CLK to output the shifted signal through the output terminal "Q" thereof.

The eighth flag latch 428 may receive the reset signal RST through a reset input terminal "R" thereof, may receive the clock signal CLK through a clock input terminal "C" thereof, and may receive the third mode signal MD<3> through a selection input terminal "S" thereof. The eighth flag latch 428 may initialize logic levels of a first output terminal "Q1." and a second output terminal "Q2" thereof to a logic "low" level if the reset signal RST is generated. The eighth flag latch 428 may receive an output signal of the seventh flag latch 427, which is outputted through the output terminal "Q" of the seventh flag latch 427, through an input terminal "D" thereof and may shift the output signal of the seventh flag latch 427 by one cycle of the clock signal CLK to output the shifted signal through the first output terminal "Q1" of the eighth flag latch 428. The eighth flag latch 428 may output a signal of the first output terminal "Q1" as the internal write flag IWTTF through the second output terminal "Q2" if the third mode signal MD<3> is generated.

Figure 5:
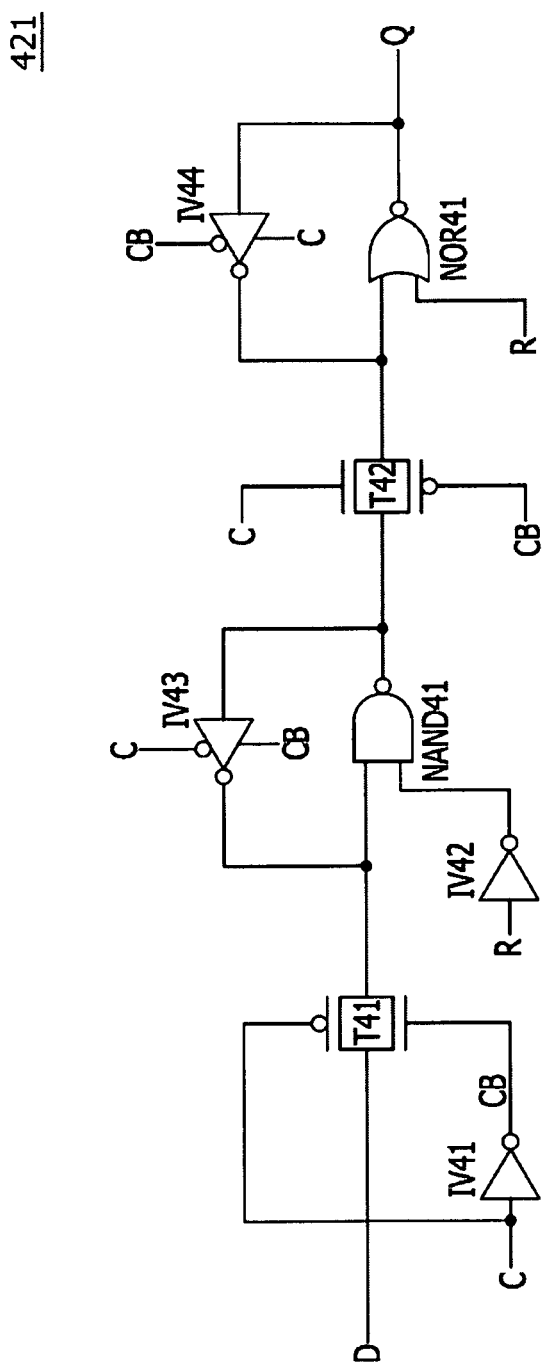
FIG. 5 is a circuit diagram illustrating an example of a first flag latch included in the internal write flag generation circuit of FIG. 4.

Referring to FIG. 5, the first flag latch 421 may be configured to perform inversion, OR, and AND operations, and may include, for example but not limited to, an inverter IV41, a transfer gate T41, an inverter IV42, a NAND gate NAND41, an inverter IV43, a transfer gate T42, a NOR gate NOR41 and an inverter IV44. The inverter IV41 may inversely buffer a signal of the clock input terminal "C" of the first flag latch 421 to generate an inverted clock signal CB. The transfer gate T41 may be turned on to transmit the write flag WTTF inputted to the input terminal "D" of the first flag latch 421 to an input terminal of the NAND gate NAND41 if the signal of the clock input terminal "C" of the first flag latch 421 has a logic "low" level. The inverter IV42 may inversely buffer a signal inputted to the reset input terminal "R" of the first flag latch 421 to output the inversely buffered signal. The NAND gate NAND41 may perform a logical NAND operation of an output signal of the transfer gate T41 and an output signal of the inverter IV42 to output the result of the logical NAND operation. The inverter IV43 may inversely buffer an output signal of the NAND gate NAND41 to output the inversely buffered signal to an input terminal of the NAND gate NAND41 corresponding to an output terminal of the transfer gate T41 if the signal of the clock input terminal "C" of the first flag latch 421 has a logic "low" level. The transfer gate T42 may be turned on to transmit an output signal of the NAND gate NAND41 to an input terminal of the NOR gate NOR41 if the signal of the clock input terminal "C" of the first flag latch 421 has a logic "high" level. The NOR gate NOR41 may perform a logical NOR operation of an output signal of the transfer gate T42 and a signal of the reset input terminal "R" of the first flag latch 421 to output the result of the logical NOR operation to the output terminal "Q" of the first flag latch 421. The inverter IV44 may inversely buffer a signal of the output terminal "Q" of the first flag latch 421 to output the inversely buffered signal to an input terminal of the NOR gate NOR41 corresponding an output terminal of the transfer gate T42 if the signal of the clock input terminal "C" of the first flag latch 421 has a logic "high" level. The first flag latch 421 may initialize a level of the output terminal "Q" thereof to a logic "low" level if the reset signal RST is generated. The first flag latch 421 may shift the write flag WTTF inputted to the input terminal "D" thereof by one cycle of the clock signal CLK to output the shifted flag of the write flag WTTF to the output terminal "Q" thereof. Each of the third flag latch 423, the fifth flag latch 425, the sixth flag latch 426 and the seventh flag latch 427 may be realized using the same circuit as the first flag latch 421 illustrated in FIG. 5.

Figure 6:
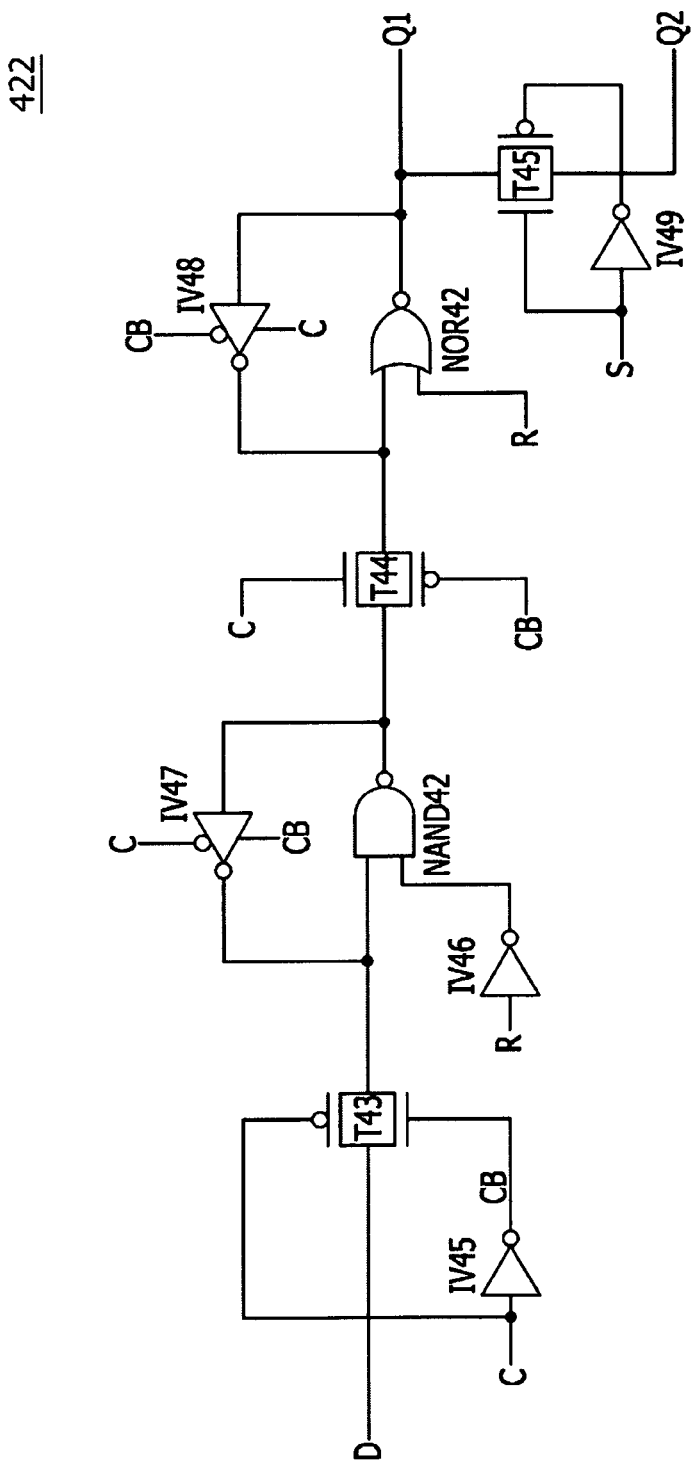
FIG. 6 is a circuit diagram illustrating an example of a second flag latch included in the internal write flag generation circuit of FIG. 4.

Referring to FIG. 6, the second flag latch 422 may be configured to perform an inversion, AND, and OR operations, and may include, for example but not limited to, an inverter IV45, a transfer gate T43, an inverter IV46, a NAND gate NAND42, an inverter IV47, a transfer gate T44, a NOR gate NOR42, an inverter IV48, an inverter IV49 and a transfer gate T45. The inverter IV45 may inversely buffer a signal of the clock input terminal "C" of the second flag latch 422 to generate the inverted clock signal CB. The transfer gate T43 may be turned on to transmit a signal inputted to the input terminal "D" of the second flag latch 422 to an input terminal of the NAND gate NAND42 if the signal of the clock input terminal "C" of the second flag latch 422 has a logic "low" level. The inverter IV46 may inversely buffer a signal inputted to the reset input terminal "R" of the second flag latch 422 to output the inversely buffered signal. The NAND gate NAND42 may perform a logical NAND operation of an output signal of the transfer gate T43 and an output signal of the inverter IV46 to output the result of the logical NAND operation. The inverter IV47 may inversely buffer an output signal of the NAND gate NAND42 to output the inversely buffered signal to an input terminal of the NAND gate NAND42 corresponding to an output terminal of the transfer gate T43 if the signal of the clock input terminal "C" of the second flag latch 422 has a logic "low" level. The transfer gate T44 may be turned on to transmit an output signal of the NAND gate NAND42 to an input terminal of the NOR gate NOR42 if the signal of the clock input terminal "C" of the second flag latch 422 has a logic "high" level. The NOR gate NOR42 may perform a logical NOR operation of an output signal of the transfer gate T44 and a signal of the reset input terminal "R" of the second flag latch 422 to output the result of the logical NOR operation to the first output terminal "Q1" of the second flag latch 422. The inverter IV48 may inversely buffer a signal of the first output terminal "Q1" of the second flag latch 422 to output the inversely buffered signal to an input terminal of the NOR gate NOR42 corresponding an output terminal of the transfer gate T44 if the signal of the clock input terminal "C" of the second flag latch 422 has a logic "high" level. The inverter IV49 may inversely buffer the first mode signal MD<1> inputted to the selection input terminal "S" of the second flag latch 422 to output the inversely buffered signal of the first mode signal MD<1>. The transfer gate T45 may be turned on to transmit a signal of the first output terminal "Q1." of the second flag latch 422 to the second output terminal "Q2" of the second flag latch 422 if the first mode signal MD<1> is generated. The second flag latch 422 may initialize a level of the first output terminal "Q1." thereof to a logic "low" level if the reset signal RST is generated. The second flag latch 422 may shift an output signal of the first flag latch 421 inputted to the input terminal "D" of the second flag latch 422 by one cycle of the clock signal CLK to output the shifted signal to the first output terminal "Q1" of the second flag latch 422. The second flag latch 422 may transmit the signal of the first output terminal "Q1" of the second flag latch 422 to the second output terminal "Q2" of the second flag latch 422 if the first mode signal MD<1> is generated. Each of the fourth flag latch 424 and the eighth flag latch 428 may be realized using the same circuit as the second flag latch 422 illustrated in FIG. 6.

Figure 7:
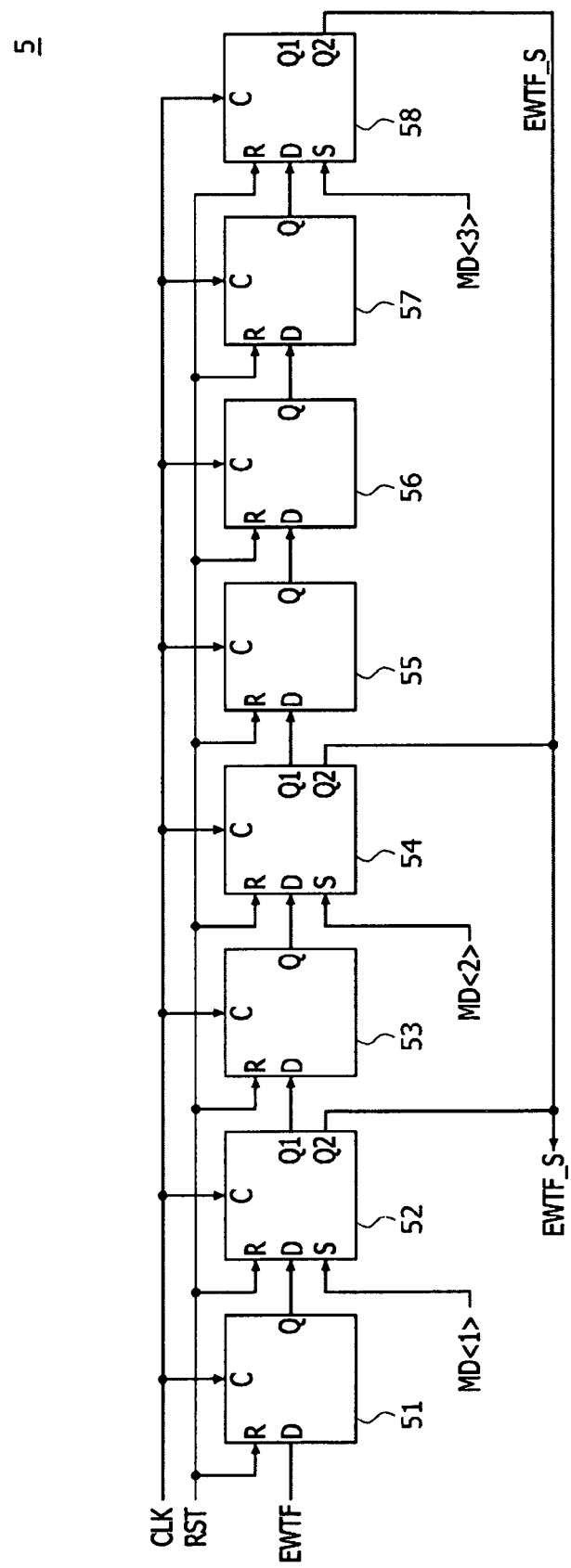
FIG. 7 is a circuit diagram illustrating an example of a shifted write signal generation circuit included in the semiconductor device of FIG. 1.

Referring to FIG. 7, the shifted write signal generation circuit 5 may include a first write latch 51, a second write latch 52, a third write latch 53, a fourth write latch 54, a fifth write latch 55, a sixth write latch 56, a seventh write latch 57 and an eighth write latch 58. Each of the first to eighth write latches 51, 52, 53, 54, 55, 56, 57 and 58 may be realized using a D-flip flop.

The first write latch 51 may receive the reset signal RST through a reset input terminal "R" thereof and may receive the clock signal CLK through a clock input terminal "C" thereof. The first write latch 51 may initialize a level of an output terminal "Q" thereof to a logic "low" level if the reset signal RST is generated. The first write latch 51 may shift the second write signal EWTF inputted through an input terminal "D" thereof by one cycle of the clock signal CLK to output the shifted signal of the second write signal EWTF through the output terminal "Q".

The second write latch 52 may receive the reset signal RST through a reset input terminal "R" thereof, may receive the clock signal CLK through a clock input terminal "C" thereof, and may receive the first mode signal MD<1> through a selection input terminal "S" thereof. The second write latch 52 may initialize logic levels of a first output terminal "Q1" and a second output terminal "Q2" thereof to a logic "low" level if the reset signal RST is generated. The second write latch 52 may receive an output signal of the first write latch 51, which is outputted through the output terminal "Q" of the first write latch 51, through an input terminal "D" thereof and may shift the output signal of the first write latch 51 by one cycle of the clock signal CLK to output the shifted signal through the first output terminal "Q1". The second write latch 52 may output a signal of the first output terminal "Q1" as the shifted write signal EWTF_S through the second output terminal "Q2" if the first mode signal MD<1> is generated.

The third write latch 53 may receive the reset signal RST through a reset input terminal "R" thereof and may receive the clock signal CLK through a clock input terminal "C" thereof. The third write latch 53 may initialize a level of an output terminal "Q" thereof to a logic "low" level if the reset signal RST is generated. The third write latch 53 may receive an output signal of the second write latch 52, which is outputted through the first output terminal "Q1" of the second write latch 52, through an input terminal "D" thereof and may shift the output signal of the second write latch 52 by one cycle of the clock signal CLK to output the shifted signal through the output terminal "Q" thereof.

The fourth write latch 54 may receive the reset signal RST through a reset input terminal "R" thereof, may receive the clock signal CLK through a clock input terminal "C" thereof, and may receive the second mode signal MD<2> through a selection input terminal "S" thereof. The fourth write latch 54 may initialize logic levels of a first output terminal "Q1." and a second output terminal "Q2" thereof to a logic "low" level if the reset signal RST is generated. The fourth write latch 54 may receive an output signal of the third write latch 53, which is outputted through the output terminal "Q" of the third write latch 53, through an input terminal "D" thereof and may shift the output signal of the third write latch 53 by one cycle of the clock signal CLK to output the shifted signal through the first output terminal "Q1" of the fourth write latch 54. The fourth write latch 54 may output a signal of the first output terminal "Q1." as the shifted write signal EWTF_S through the second output terminal "Q2" if the second mode signal MD<2> is generated.

The fifth write latch 55 may receive the reset signal RST through a reset input terminal "R" thereof and may receive the clock signal CLK through a clock input terminal "C" thereof. The fifth write latch 55 may initialize a level of an output terminal "Q" thereof to a logic "low" level if the reset signal RST is generated. The fifth write latch 55 may receive an output signal of the fourth write latch 54, which is outputted through the first output terminal "Q1" of the fourth write latch 54, through an input terminal "D" thereof and may shift the output signal of the fourth write latch 54 by one cycle of the clock signal CLK to output the shifted signal through the output terminal "Q" thereof.

The sixth write latch 56 may receive the reset signal RST through a reset input terminal "R" thereof and may receive the clock signal CLK through a clock input terminal "C" thereof. The sixth write latch 56 may initialize a level of an output terminal "Q" thereof to a logic "low" level if the reset signal RST is generated. The sixth write latch 56 may receive an output signal of the fifth write latch 55, which is outputted through the output terminal "Q" of the fifth write latch 55, through an input terminal "D" thereof and may shift the output signal of the fifth write latch 55 by one cycle of the clock signal CLK to output the shifted signal through the output terminal "Q" thereof.

The seventh write latch 57 may receive the reset signal RST through a reset input terminal "R" thereof and may receive the clock signal CLK through a clock input terminal "C" thereof. The seventh write latch 57 may initialize a level of an output terminal "Q" thereof to a logic "low" level if the reset signal RST is generated. The seventh write latch 57 may receive an output signal of the sixth write latch 56, which is outputted through the output terminal "Q" of the sixth write latch 56, through an input terminal "D" thereof and may shift the output signal of the sixth write latch 56 by one cycle of the clock signal CLK to output the shifted signal through the output terminal "Q" thereof.

The eighth write latch 58 may receive the reset signal RST through a reset input terminal "R" thereof, may receive the clock signal CLK through a clock input terminal "C" thereof, and may receive the third mode signal MD<3> through a selection input terminal "S" thereof. The eighth write latch 58 may initialize logic levels of a first output terminal "Q1" and a second output terminal "Q2" thereof to a logic "low" level if the reset signal RST is generated. The eighth write latch 58 may receive an output signal of the seventh write latch 57, which is outputted through the output terminal "Q" of the seventh write latch 57, through an input terminal "D" thereof and may shift the output signal of the seventh write latch 57 by one cycle of the clock signal CLK to output the shifted signal through the first output terminal "Q1" of the eighth write latch 58. The eighth write latch 58 may output a signal of the first output terminal "Q1" as the shifted write signal EWTF_S through the second output terminal "Q2" if the third mode signal MD<3> is generated.

The shifted write signal generation circuit 5 may shift the second write signal EWTF by two cycles of the clock signal CLK to generate the shifted write signal EWTF_S if the first mode signal MD<1> is generated. The shifted write signal generation circuit 5 may shift the second write signal EWTF by four cycles of the clock signal CLK to generate the shifted write signal EWTF_S if the second mode signal MD<2> is generated. The shifted write signal generation circuit 5 may shift the second write signal EWTF by eight cycles of the clock signal CLK to generate the shifted write signal EWTF_S if the third mode signal MD<3> is generated.

Figure 8:
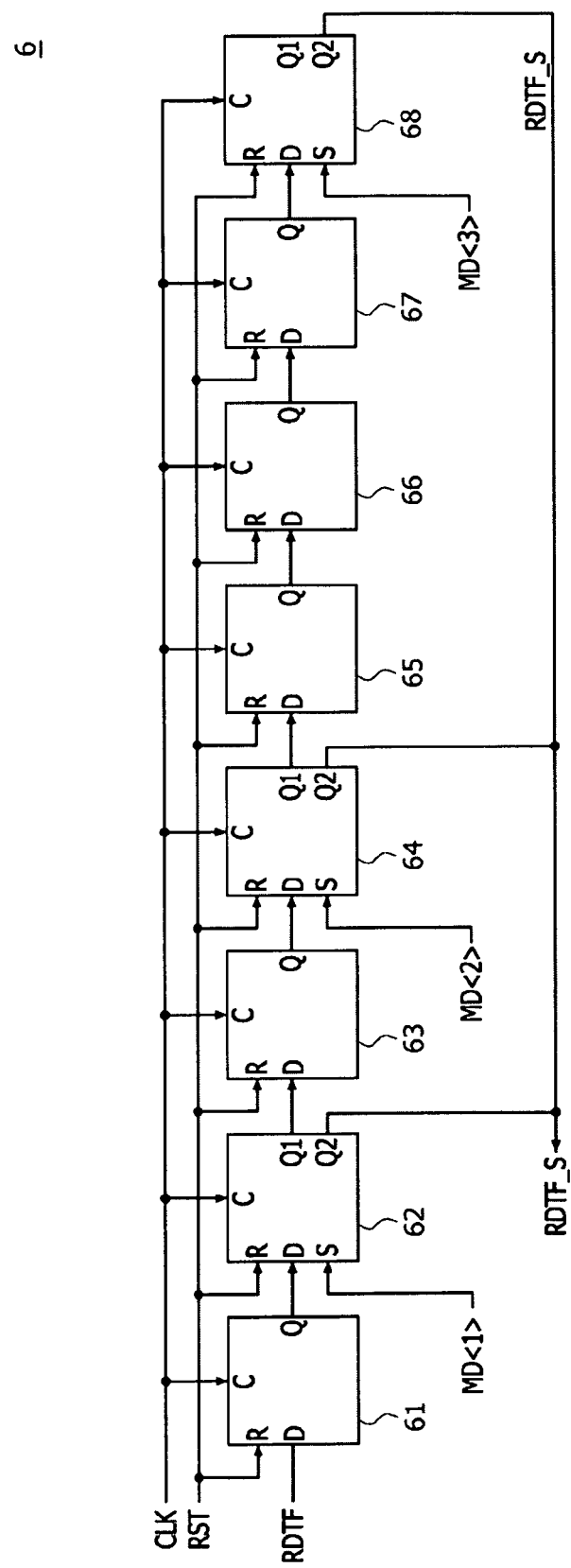
FIG. 8 is a circuit diagram illustrating an example of a shifted read signal generation circuit included in the semiconductor device of FIG. 1.

Referring to FIG. 8, the shifted read signal generation circuit 6 may include a first read latch 61, a second read latch 62, a third read latch 63, a fourth read latch 64, a fifth read latch 65, a sixth read latch 66, a seventh read latch 67 and an eighth read latch 68. Each of the first to eighth read latches 61, 62, 63, 64, 65, 66, 67 and 68 may be realized using a D-flip flop.

The first read latch 61 may receive the reset signal RST through a reset input terminal "R" thereof and may receive the clock signal CLK through a clock input terminal "C" thereof. The first read latch 61 may initialize a level of an output terminal "Q" thereof to a logic "low" level if the reset signal RST is generated. The first read latch 61 may shift the read signal RDTF inputted through an input terminal "D" thereof by one cycle of the clock signal CLK to output the shifted signal of the read signal RDTF through the output terminal "Q".

The second read latch 62 may receive the reset signal RST through a reset input terminal "R" thereof, may receive the clock signal CLK through a clock input terminal "C" thereof, and may receive the first mode signal MD<1> through a selection input terminal "S" thereof. The second read latch 62 may initialize logic levels of a first output terminal "Q1" and a second output terminal "Q2" thereof to a logic "low" level if the reset signal RST is generated. The second read latch 62 may receive an output signal of the first read latch 61, which is outputted through the output terminal "Q" of the first read latch 61, through an input terminal "D" thereof and may shift the output signal of the first read latch 61 by one cycle of the clock signal CLK to output the shifted signal through the first output terminal "Q1". The second read latch 62 may output a signal of the first output terminal "Q1" as the shifted read signal RDTF_S through the second output terminal "Q2" if the first mode signal MD<1> is generated.

The third read latch 63 may receive the reset signal RST through a reset input terminal "R" thereof and may receive the clock signal CLK through a clock input terminal "C" thereof. The third read latch 63 may initialize a level of an output terminal "Q" thereof to a logic "low" level if the reset signal RST is generated. The third read latch 63 may receive an output signal of the second read latch 62, which is outputted through the first output terminal "Q1" of the second read latch 62, through an input terminal "D" thereof and may shift the output signal of the second read latch 62 by one cycle of the clock signal CLK to output the shifted signal through the output terminal "Q" thereof.

The fourth read latch 64 may receive the reset signal RST through a reset input terminal "R" thereof, may receive the clock signal CLK through a clock input terminal "C" thereof, and may receive the second mode signal MD<2> through a selection input terminal "S" thereof. The fourth read latch 64 may initialize logic levels of a first output terminal "Q1" and a second output terminal "Q2" thereof to a logic "low" level if the reset signal RST is generated. The fourth read latch 64 may receive an output signal of the third read latch 63, which is outputted through the output terminal "Q" of the third read latch 63, through an input terminal "D" thereof and may shift the output signal of the third read latch 63 by one cycle of the clock signal CLK to output the shifted signal through the first output terminal "Q1" of the fourth read latch 64. The fourth read latch 64 may output a signal of the first output terminal "Q1" as the shifted read signal RDTF_S through the second output terminal "Q2" if the second mode signal MD<2> is generated.

The fifth read latch 65 may receive the reset signal RST through a reset input terminal "R" thereof and may receive the clock signal CLK through a clock input terminal "C" thereof. The fifth read latch 65 may initialize a level of an output terminal "Q" thereof to a logic "low" level if the reset signal RST is generated. The fifth read latch 65 may receive an output signal of the fourth read latch 64, which is outputted through the first output terminal "Q1" of the fourth read latch 64, through an input terminal "D" thereof and may shift the output signal of the fourth read latch 64 by one cycle of the clock signal CLK to output the shifted signal through the output terminal "Q" thereof.

The sixth read latch 66 may receive the reset signal RST through a reset input terminal "R" thereof and may receive the clock signal CLK through a clock input terminal "C" thereof. The sixth read latch 66 may initialize a level of an output terminal "Q" thereof to a logic "low" level if the reset signal RST is generated. The sixth read latch 66 may receive an output signal of the fifth read latch 65, which is outputted through the output terminal "Q" of the fifth read latch 65, through an input terminal "D" thereof and may shift the output signal of the fifth read latch 65 by one cycle of the clock signal CLK to output the shifted signal through the output terminal "Q" thereof.

The seventh read latch 67 may receive the reset signal RST through a reset input terminal "R" thereof and may receive the clock signal CLK through a clock input terminal "C" thereof. The seventh read latch 67 may initialize a level of an output terminal "Q" thereof to a logic "low" level if the reset signal RST is generated. The seventh read latch 67 may receive an output signal of the sixth read latch 66, which is outputted through the output terminal "Q" of the sixth read latch 66, through an input terminal "D" thereof and may shift the output signal of the sixth read latch 66 by one cycle of the clock signal CLK to output the shifted signal through the output terminal "Q" thereof.

The eighth read latch 68 may receive the reset signal RST through a reset input terminal "R" thereof, may receive the clock signal CLK through a clock input terminal "C" thereof, and may receive the third mode signal MD<3> through a selection input terminal "S" thereof. The eighth read latch 68 may initialize logic levels of a first output terminal "Q1" and a second output terminal "Q2" thereof to a logic "low" level if the reset signal RST is generated. The eighth read latch 68 may receive an output signal of the seventh read latch 67, which is outputted through the output terminal "Q" of the seventh read latch 67, through an input terminal "D" thereof and may shift the output signal of the seventh read latch 67 by one cycle of the clock signal CLK to output the shifted signal through the first output terminal "Q1" of the eighth read latch 68. The eighth read latch 68 may output a signal of the first output terminal "Q1" as the shifted read signal RDTF_S through the second output terminal "Q2" if the third mode signal MD<3> is generated.

The shifted read signal generation circuit 6 may shift the read signal RDTF by two cycles of the clock signal CLK to generate the shifted read signal RDTF_S if the first mode signal MD<1> is generated. The shifted read signal generation circuit 6 may shift the read signal RDTF by four cycles of the clock signal CLK to generate the shifted read signal RDTF_S if the second mode signal MD<2> is generated. The shifted read signal generation circuit 6 may shift the read signal RDTF by eight cycles of the clock signal CLK to generate the shifted read signal RDTF_S if the third mode signal MD<3> is generated.

Figure 9:
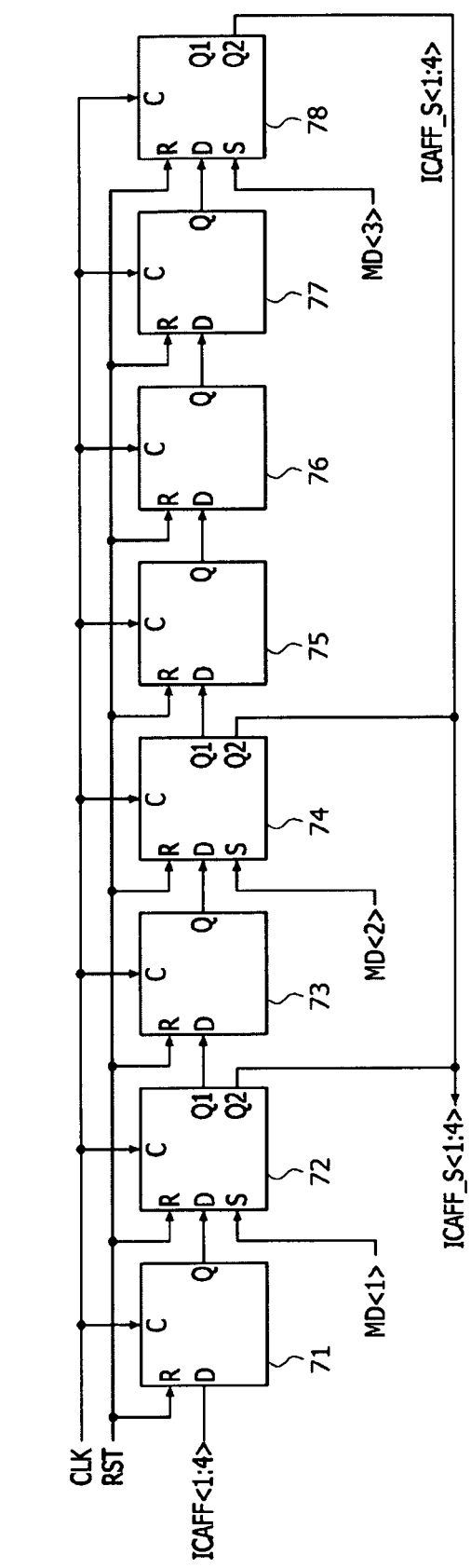
FIG. 9 is a circuit diagram illustrating an example of a shifted address generation circuit included in the semiconductor device of FIG. 1.

Referring to FIG. 9, the shifted address generation circuit 7 may include a first address latch 71, a second address latch 72, a third address latch 73, a fourth address latch 74, a fifth address latch 75, a sixth address latch 76, a seventh address latch 77 and an eighth address latch 78. Each of the first to eighth address latches 71, 72, 73, 74, 75, 76, 77 and 78 may be realized using a D-flip flop.

The first address latch 71 may receive the reset signal RST through a reset input terminal "R" thereof and may receive the clock signal CLK through a clock input terminal "C" thereof. The first address latch 71 may initialize a level of an output terminal "Q" thereof to a logic "low" level if the reset signal RST is generated. The first address latch 71 may shift the internal address ICAFF<1:4> inputted through an input terminal "D" thereof by one cycle of the clock signal CLK to output the shifted signal of the internal address ICAFF<1:4> through the output terminal "Q".

The second address latch 72 may receive the reset signal RST through a reset input terminal "R" thereof, may receive the clock signal CLK through a clock input terminal "C" thereof, and may receive the first mode signal MD<1> through a selection input terminal "S" thereof. The second address latch 72 may initialize logic levels of a first output terminal "Q1" and a second output terminal "Q2" thereof to a logic "low" level if the reset signal RST is generated. The second address latch 72 may receive an output signal of the first address latch 71, which is outputted through the output terminal "Q" of the first address latch 71, through an input terminal "D" thereof and may shift the output signal of the first address latch 71 by one cycle of the clock signal CLK to output the shifted signal through the first output terminal "Q1". The second address latch 72 may output a signal of the first output terminal "Q1" as the shifted internal address ICAFF_S<1:4> through the second output terminal "Q2" if the first mode signal MD<1> is generated.

The third address latch 73 may receive the reset signal RST through a reset input terminal "R" thereof and may receive the clock signal CLK through a clock input terminal "C" thereof. The third address latch 73 may initialize a level of an output terminal "Q" thereof to a logic "low" level if the reset signal RST is generated. The third address latch 73 may receive an output signal of the second address latch 72, which is outputted through the first output terminal "Q1" of the second address latch 72, through an input terminal "D" thereof and may shift the output signal of the second address latch 72 by one cycle of the clock signal CLK to output the shifted signal through the output terminal "Q" thereof.

The fourth address latch 74 may receive the reset signal RST through a reset input terminal "R" thereof, may receive the clock signal CLK through a clock input terminal "C" thereof, and may receive the second mode signal MD<2> through a selection input terminal "S" thereof. The fourth address latch 74 may initialize logic levels of a first output terminal "Q1" and a second output terminal "Q2" thereof to a logic "low" level if the reset signal RST is generated. The fourth address latch 74 may receive an output signal of the third address latch 73, which is outputted through the output terminal "Q" of the third address latch 73, through an input terminal "D" thereof and may shift the output signal of the third address latch 73 by one cycle of the clock signal CLK to output the shifted signal through the first output terminal "Q1" of the fourth address latch 74. The fourth address latch 74 may output a signal of the first output terminal "Q1" as the shifted internal address ICAFF_S<1:4> through the second output terminal "Q2" if the second mode signal MD<2> is generated.

The fifth address latch 75 may receive the reset signal RST through a reset input terminal "R" thereof and may receive the clock signal CLK through a clock input terminal "C" thereof. The fifth address latch 75 may initialize a level of an output terminal "Q" thereof to a logic "low" level if the reset signal RST is generated. The fifth address latch 75 may receive an output signal of the fourth address latch 74, which is outputted through the first output terminal "Q1" of the fourth address latch 74, through an input terminal "D" thereof and may shift the output signal of the fourth address latch 74 by one cycle of the clock signal CLK to output the shifted signal through the output terminal "Q" thereof.

The sixth address latch 76 may receive the reset signal RST through a reset input terminal "R" thereof and may receive the clock signal CLK through a clock input terminal "C" thereof. The sixth address latch 76 may initialize a level of an output terminal "Q" thereof to a logic "low" level if the reset signal RST is generated. The sixth address latch 76 may receive an output signal of the fifth address latch 75, which is outputted through the output terminal "Q" of the fifth address latch 75, through an input terminal "D" thereof and may shift the output signal of the fifth address latch 75 by one cycle of the clock signal CLK to output the shifted signal through the output terminal "Q" thereof.

The seventh address latch 77 may receive the reset signal RST through a reset input terminal "R" thereof and may receive the clock signal CLK through a clock input terminal "C" thereof. The seventh address latch 77 may initialize a level of an output terminal "Q" thereof to a logic "low" level if the reset signal RST is generated. The seventh address latch 77 may receive an output signal of the sixth address latch 76, which is outputted through the output terminal "Q" of the sixth address latch 76, through an input terminal "D" thereof and may shift the output signal of the sixth address latch 76 by one cycle of the clock signal CLK to output the shifted signal through the output terminal "Q" thereof.

The eighth address latch 78 may receive the reset signal RST through a reset input terminal "R" thereof, may receive the clock signal CLK through a clock input terminal "C" thereof, and may receive the third mode signal MD<3> through a selection input terminal "S" thereof. The eighth address latch 78 may initialize logic levels of a first output terminal "Q1" and a second output terminal "Q2" thereof to a logic "low" level if the reset signal RST is generated. The eighth address latch 78 may receive an output signal of the seventh address latch 77, which is outputted through the output terminal "Q" of the seventh address latch 77, through an input terminal "D" thereof and may shift the output signal of the seventh address latch 77 by one cycle of the clock signal CLK to output the shifted signal through the first output terminal "Q1" of the eighth address latch 78. The eighth address latch 78 may output a signal of the first output terminal "Q1" as the shifted internal address ICAFF_S<1:4> through the second output terminal "Q2" if the third mode signal MD<3> is generated.

The shifted address generation circuit 7 may shift the internal address ICAFF<1:4> by two cycles of the clock signal CLK to generate the shifted internal address ICAFF_S<1:4> if the first mode signal MD<1> is generated. The shifted address generation circuit 7 may shift the internal address ICAFF<1:4> by four cycles of the clock signal CLK to generate the shifted internal address ICAFF_S<1:4> if the second mode signal MD<2> is generated. The shifted address generation circuit 7 may shift the internal address ICAFF<1:4> by eight cycles of the clock signal CLK to generate the shifted internal address ICAFF_S<1:4> if the third mode signal MD<3> is generated.

Figure 10:
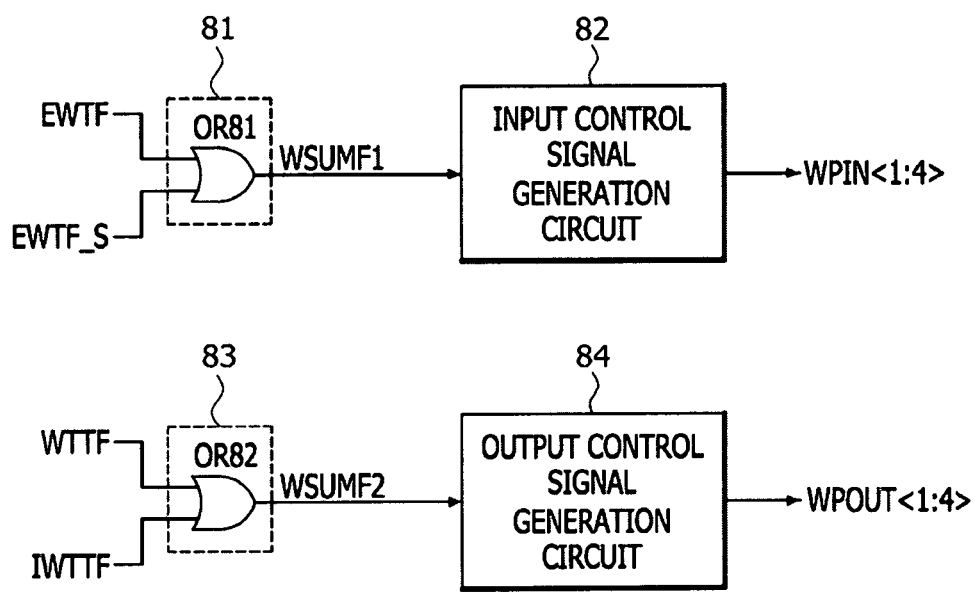
FIG. 10 illustrates a configuration of an example of a write address control circuit included in the semiconductor device of FIG. 1.

Referring to FIG. 10, the write address control circuit 8 may include a first write synthesis flag generation circuit 81, an input control signal generation circuit 82, a second write synthesis flag generation circuit 83 and an output control signal generation circuit 84.

The first write synthesis flag generation circuit 81 may be configured to perform an OR operation, and may include, for example but not limited to, an OR gate OR81. The OR gate OR81 may perform a logical OR operation of the second write signal EWTF and the shifted write signal EWTF_S to generate a first write synthesis flag WSUMF1. The first write synthesis flag generation circuit 81 may generate the first write synthesis flag WSUMF1 if the second write signal EWTF or the shifted write signal EWTF_S is generated.

The input control signal generation circuit 82 may sequentially generate the first to fourth write input control signals WPIN<1:4> whenever the first write synthesis flag WSUMF1 is generated. The input control signal generation circuit 82 may generate the first write input control signal WPIN<1> if the first write synthesis flag WSUMF1 is generated a first time, may generate the second write input control signal WPIN<2> if the first write synthesis flag WSUMF1 is generated a second time, may generate the third write input control signal WPIN<3> if the first write synthesis flag WSUMF1 is generated a third time, and may generate the fourth write input control signal WPIN<4> if the first write synthesis flag WSUMF1 is generated a fourth time.

The second write synthesis flag generation circuit 83 may be configured to perform an OR operation, and may include, for example but not limited to, an OR gate OR82. The OR gate OR82 may perform a logical OR operation of the write flag WTTF and the internal write flag IWTTF to generate a second write synthesis flag WSUMF2. The second write synthesis flag generation circuit 83 may generate the second write synthesis flag WSUMF2 if the write flag WTTF or the internal write flag IWTTF is generated.

The output control signal generation circuit 84 may generate the first write output control signal WPOUT<1> if the second write synthesis flag WSUMF2 is generated a first time, may generate the second write output control signal WPOUT<2> if the second write synthesis flag WSUMF2 is generated a second time, may generate the third write output control signal WPOUT<3> if the second write synthesis flag WSUMF2 is generated a third time, and may generate the fourth write output control signal WPOUT<4> if the second write synthesis flag WSUMF2 is generated a fourth time.

The write address control circuit 8 may generate the first write input control signal WPIN<1> if the second write signal EWTF or the shifted write signal EWTF_S is generated a first time, may generate the second write input control signal WPIN<2> if the second write signal EWTF or the shifted write signal EWTF_S is generated a second time, may generate the third write input control signal WPIN<3> if the second write signal EWTF or the shifted write signal EWTF_S is generated a third time, and may generate the fourth write input control signal WPIN<4> if the second write signal EWTF or the shifted write signal EWTF_S is generated a fourth time. The write address control circuit 8 may generate the first write output control signal WPOUT<1> if the write flag WTTF or the internal write flag IWTTF is generated a first time, may generate the second write output control signal WPOUT<2> if the write flag WTTF or the internal write flag IWTTF is generated a second time, may generate the third write output control signal WPOUT<3> if the write flag WTTF or the internal write flag IWTTF is generated a third time, and may generate the fourth write output control signal WPOUT<4> if the write flag WTTF or the internal write flag IWTTF is generated a fourth time.

Figure 11:
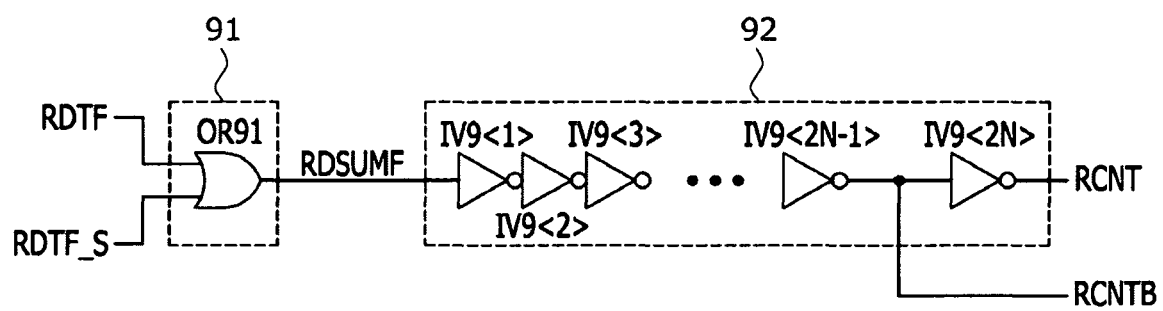
FIG. 11 is a circuit diagram illustrating an example of a read address control circuit included in the semiconductor device of FIG. 1.

Referring to FIG. 11, the read address control circuit 9 may include a read synthesis signal generation circuit 91 and a read control signal generation circuit 92.

The read synthesis signal generation circuit 91 may be configured to perform an OR operation, and may include, for example but not limited to, an OR gate OR91. The OR gate OR91 may perform a logic OR operation of the read signal RDTF and the shifted read signal RDTF_S to generate a read synthesis flag RSUMF. The read synthesis signal generation circuit 91 may generate the read synthesis flag RSUMF if the read signal RDTF or the shifted read signal RDTF_S is generated.

The read control signal generation circuit 92 may be configured to perform an inversion operation and may be realized using, for example but not limited to, an inverter chain comprised of a plurality of inverters that are cascaded. For example, the read control signal generation circuit 92 may include an inverter chain comprised of first to $(2N)^{th}$ inverters IV9<1>, IV9<2>, ..., IV9<2N−1> and IV9<2N>. The read control signal generation circuit 92 may delay the read synthesis flag RSUMF by a predetermined read delay period to generate the read control signal RCNT. The read control signal generation circuit 92 may also generate the inverted read control signal RCNTB having an inverted logic level of the read control signal RCNT.

The read address control circuit 9 may generate the read control signal RCNT which is created at a point of time that the predetermined read delay period elapses from a point of time that the read signal RDTF or the shifted read signal RDTF_S is generated. The read address control circuit 9 may also generate the inverted read control signal RCNTB having an opposite logic level to the read control signal RCNT.

Figure 12:
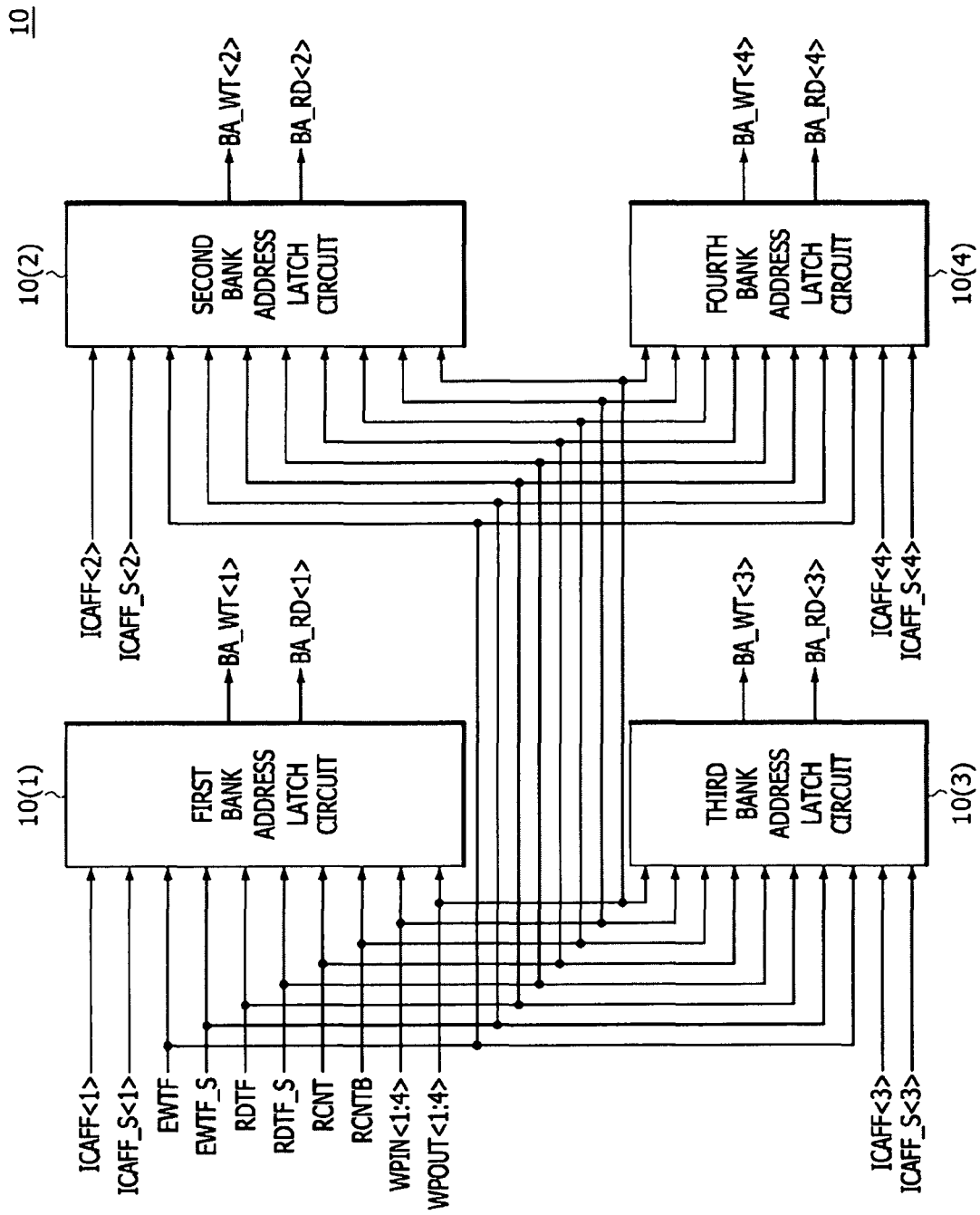
FIG. 12 is a block diagram illustrating an example of a bank address latch circuit included in the semiconductor device of FIG. 1.

Referring to FIG. 12, the bank address latch circuit 10 may include a first bank address latch circuit 10(1), a second bank address latch circuit 10(2), a third bank address latch circuit 10(3) and a fourth bank address latch circuit 10(4).

During the write operation, the first bank address latch circuit 10(1) may latch the first bit ICAFF<1> of the internal address ICAFF<1:4> in synchronization with the second write signal EWTF, may store the latched datum of the first bit ICAFF<1> of the internal address ICAFF<1:4> in synchronization with the first to fourth write input control signals WPIN<1:4>, and may output the stored datum of the first bit ICAFF<1> of the internal address ICAFF<1:4> as the first bit BA_WT<1> of the write bank address BA_WT<1:4> in synchronization with the first to fourth write output control signals WPOUT<1:4>. During the write operation, the first bank address latch circuit 10(1) may latch the first bit ICAFF_S<1> of the shifted internal address ICAFF_S<1:4> in synchronization with the shifted write signal EWTF_S, may store the latched datum of the first bit ICAFF_S<1> of the shifted internal address ICAFF_S<1:4> in synchronization with the first to fourth write input control signals WPIN<1:4>, and may output the stored datum of the first bit ICAFF_S<1> of the shifted internal address ICAFF_S<1:4> as the first bit BA_WT<1> of the write bank address BA_WT<1:4> in synchronization with the first to fourth write output control signals WPOUT<1:4>. During the read operation, the first bank address latch circuit 10(1)

may latch the first bit ICAFF<1> of the internal address ICAFF<1:4> in synchronization with the read signal RDTF and may output the latched datum of the first bit ICAFF<1> of the internal address ICAFF<1:4> as the first bit BA_RD<1> of the read bank address BA_RD<1:4> in synchronization with the read control signal RCNT. During the read operation, the first bank address latch circuit 10(1) may latch the first bit ICAFF<1> of the shifted internal address ICAFF_S<1:4> in synchronization with the shifted read signal RDTF_S and may output the latched datum of the first bit ICAFF<1> of the shifted internal address ICAFF_S<1:4> as the first bit BA_RD<1> of the read bank address BA_RD<1:4> in synchronization with the read control signal RCNT.

During the write operation, the second bank address latch circuit 10(2) may latch the second bit ICAFF<2> of the internal address ICAFF<1:4> in synchronization with the second write signal EWTF, may store the latched datum of the second bit ICAFF<2> of the internal address ICAFF<1:4> in synchronization with the first to fourth write input control signals WPIN<1:4>, and may output the stored datum of the second bit ICAFF<2> of the internal address ICAFF<1:4> as the second bit BA_WT<2> of the write bank address BA_WT<1:4> in synchronization with the first to fourth write output control signals WPOUT<1:4>. During the write operation, the second bank address latch circuit 10(2) may latch the second bit ICAFF_S<2> of the shifted internal address ICAFF_S<1:4> in synchronization with the shifted write signal EWTF_S, may store the latched datum of the second bit ICAFF_S<2> of the shifted internal address ICAFF_S<1:4> in synchronization with the first to fourth write input control signals WPIN<1:4>, and may output the stored datum of the second bit ICAFF_S<2> of the shifted internal address ICAFF_S<1:4> as the second bit BA_WT<2> of the write bank address BA_WT<1:4> in synchronization with the first to fourth write output control signals WPOUT<1:4>. During the read operation, the second bank address latch circuit 10(2) may latch the second bit ICAFF<2> of the internal address ICAFF<1:4> in synchronization with the read signal RDTF and may output the latched datum of the second bit ICAFF<2> of the internal address ICAFF<1:4> as the second bit BA_RD<2> of the read bank address BA_RD<1:4> in synchronization with the read control signal RCNT. During the read operation, the second bank address latch circuit 10(2) may latch the second bit ICAFF<2> of the shifted internal address ICAFF_S<1:4> in synchronization with the shifted read signal RDTF_S and may output the latched datum of the second bit ICAFF<2> of the shifted internal address ICAFF_S<1:4> as the second bit BA_RD<2> of the read bank address BA_RD<1:4> in synchronization with the read control signal RCNT.

During the write operation, the third bank address latch circuit 10(3) may latch the third bit ICAFF<3> of the internal address ICAFF<1:4> in synchronization with the second write signal EWTF, may store the latched datum of the third bit ICAFF<3> of the internal address ICAFF<1:4> in synchronization with the first to fourth write input control signals WPIN<1:4>, and may output the stored datum of the third bit ICAFF<3> of the internal address ICAFF<1:4> as the third bit BA_WT<3> of the write bank address BA_WT<1:4> in synchronization with the first to fourth write output control signals WPOUT<1:4>. During the write operation, the third bank address latch circuit 10(3) may latch the third bit ICAFF_S<3> of the shifted internal address ICAFF_S<1:4> in synchronization with the shifted write signal EWTF_S, may store the latched datum of the third bit ICAFF_S<3> of the shifted internal address ICAFF_S<1:4> in synchronization with the first to fourth write input control signals WPIN<1:4>, and may output the stored datum of the third bit ICAFF_S<3> of the shifted internal address ICAFF_S<1:4> as the third bit BA_WT<3> of the write bank address BA_WT<1:4> in synchronization with the first to fourth write output control signals WPOUT<1:4>. During the read operation, the third bank address latch circuit 10(3) may latch the third bit ICAFF<3> of the internal address ICAFF<1:4> in synchronization with the read signal RDTF and may output the latched datum of the third bit ICAFF<3> of the internal address ICAFF<1:4> as the third bit BA_RD<3> of the read bank address BA_RD<1:4> in synchronization with the read control signal RCNT. During the read operation, the third bank address latch circuit 10(3) may latch the third bit ICAFF<3> of the shifted internal address ICAFF_S<1:4> in synchronization with the shifted read signal RDTF_S and may output the latched datum of the third bit ICAFF<3> of the shifted internal address ICAFF_S<1:4> as the third bit BA_RD<3> of the read bank address BA_RD<1:4> in synchronization with the read control signal RCNT.

During the write operation, the fourth bank address latch circuit 10(4) may latch the fourth bit ICAFF<4> of the internal address ICAFF<1:4> in synchronization with the second write signal EWTF, may store the latched datum of the fourth bit ICAFF<4> of the internal address ICAFF<1:4> in synchronization with the first to fourth write input control signals WPIN<1:4>, and may output the stored datum of the fourth bit ICAFF<4> of the internal address ICAFF<1:4> as the fourth bit BA_WT<4> of the write bank address BA_WT<1:4> in synchronization with the first to fourth write output control signals WPOUT<1:4>. During the write operation, the fourth bank address latch circuit 10(4) may latch the fourth bit ICAFF_S<4> of the shifted internal address ICAFF_S<1:4> in synchronization with the shifted write signal EWTF_S, may store the latched datum of the fourth bit ICAFF_S<4> of the shifted internal address ICAFF_S<1:4> in synchronization with the first to fourth write input control signals WPIN<1:4>, and may output the stored datum of the fourth bit ICAFF_S<4> of the shifted internal address ICAFF_S<1:4> as the fourth bit BA_WT<4> of the write bank address BA_WT<1:4> in synchronization with the first to fourth write output control signals WPOUT<1:4>. During the read operation, the fourth bank address latch circuit 10(4) may latch the fourth bit ICAFF<4> of the internal address ICAFF<1:4> in synchronization with the read signal RDTF and may output the latched datum of the fourth bit ICAFF<4> of the internal address ICAFF<1:4> as the fourth bit BA_RD<4> of the read bank address BA_RD<1:4> in synchronization with the read control signal RCNT. During the read operation, the fourth bank address latch circuit 10(4) may latch the fourth bit ICAFF<4> of the shifted internal address ICAFF_S<1:4> in synchronization with the shifted read signal RDTF_S and may output the latched datum of the fourth bit ICAFF<4> of the shifted internal address ICAFF_S<1:4> as the fourth bit BA_RD<4> of the read bank address BA_RD<1:4> in synchronization with the read control signal RCNT.

During the write operation, the bank address latch circuit 10 may latch the internal address ICAFF<1:4> in synchronization with the second write signal EWTF, may store the latched address of the internal address ICAFF<1:4> in synchronization with the first to fourth write input control signals WPIN<1:4>, and may output the stored address of the internal address ICAFF<1:4> as the write bank address BA_WT<1:4> in synchronization with the first to fourth write output control signals WPOUT<1:4>. During the write operation, the bank address latch circuit 10 may latch the shifted internal address ICAFF_S<1:4> in synchronization with the shifted write signal EWTF_S, may store the latched address of the shifted internal address ICAFF_S<1:4> in synchronization with the first to fourth write input control signals WPIN<1:4>, and may output the stored address of the shifted internal address ICAFF_S<1:4> as the write bank address BA_WT<1:4> in synchronization with the first to fourth write output control signals WPOUT<1:4>. During the read operation, the bank address latch circuit 10 may latch the internal address ICAFF<1:4> in synchronization with the read signal RDTF and may output the latched address of the internal address ICAFF<1:4> as the read bank address BA_RD<1:4> in synchronization with the read control signal RCNT. During the read operation, the bank address latch circuit 10 may latch the shifted internal address ICAFF_S<1:4> in synchronization with the shifted read signal RDTF_S and may output the latched address of the shifted internal address ICAFF_S<1:4> as the read bank address BA_RD<1:4> in synchronization with the read control signal RCNT.

Figure 13:
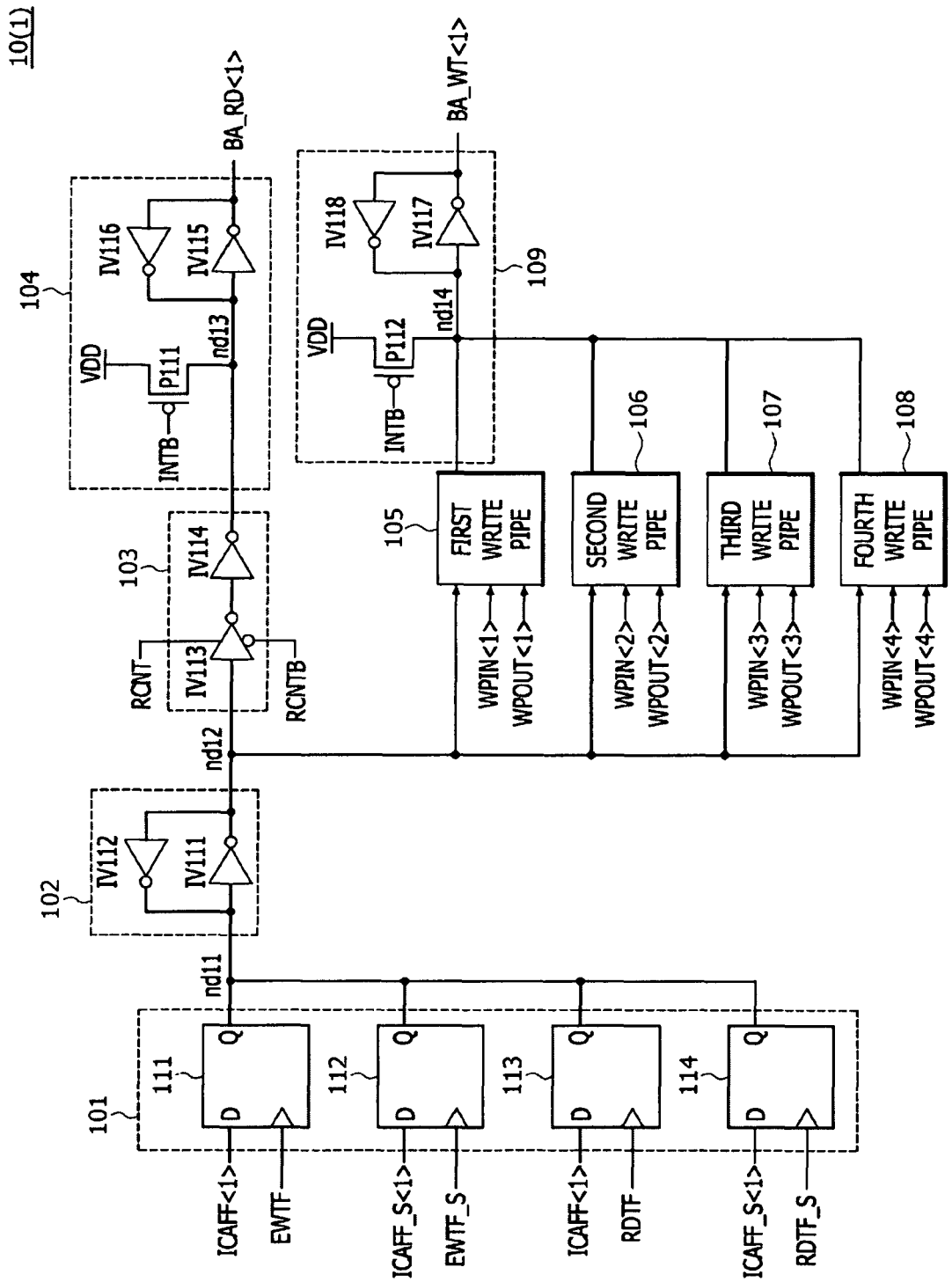
FIG. 13 is a circuit diagram illustrating an example of a first bank address latch circuit included in the bank address latch circuit of FIG. 12.

Referring to FIG. 13, the first bank address latch circuit 10(1) may include an internal address input circuit 101, an internal address latch 102, an internal address buffer 103, a read bank address output circuit 104, a first write pipe 105, a second write pipe 106, a third write pipe 107, a fourth write pipe 108 and a write bank address output circuit 109.

The internal address input circuit 101 may include a first internal address latch 111, a second internal address latch 112, a third internal address latch 113 and a fourth internal address latch 114. The first internal address latch 111 may latch the first bit ICAFF<1> of the internal address ICAFF<1:4> in synchronization with the second write signal EWTF to output the latched datum to a node nd11. The second internal address latch 112 may latch the first bit ICAFF_S<1> of the shifted internal address ICAFF_S<1:4> in synchronization with the shifted write signal EWTF_S to output the latched datum to the node nd11. The third internal address latch 113 may latch the first bit ICAFF<1> of the internal address ICAFF<1:4> in synchronization with the read signal RDTF to output the latched datum to the node nd11. The fourth internal address latch 114 may latch the first bit ICAFF_S<1> of the shifted internal address ICAFF_S<1:4> in synchronization with the shifted read signal RDTF_S to output the latched datum to the node nd11. Each of the first to fourth internal address latches 111, 112, 113 and 114 may be realized using a D-flip flop.

The internal address latch 102 may be configured to perform inversion operations and may include, for example but not limited to, an inverter IV111 and an inverter IV112. The inverter IV111 may inversely buffer a signal of the node nd11 to output the inversely buffered signal to a node nd12. The inverter IV112 may inversely buffer a signal of the node nd12 to output the inversely buffered signal to the node nd11. The internal address latch 102 may latch the signals of the nodes nd11 and nd12.

The internal address buffer 103 may be configured to perform an inversion operation and may include, for example but not limited to, an inverter IV113 and an inverter IV114. The inverter IV113 may inversely buffer a signal of the node nd12 in response to the read control signal RCNT and the inverted read control signal RCNTB to output the inversely buffered signal. The inverter IV114 may inversely buffer an output signal of the inverter IV113 to output the inversely buffered signal to a node nd13. The internal address buffer 103 may buffer a single of the node nd12 to output the buffered signal to the node nd13 if the read control signal RCNT has a logic "high" level.

The read bank address output circuit 104 may be configured to perform an inversion operation and driving operation, and may include, for example but not limited to, a PMOS transistor P111, an inverter IV115 and an inverter IV116. The PMOS transistor P111 may drive the node nd13 to a power supply voltage VDD if an initialization signal INTB is generated. The initialization signal INTB may be generated to have a logic "low" level for an initialization operation. The inverter IV115 may inversely buffer a signal of the node nd13 to output the inversely buffered signal as the first bit BA_RD<1> of the read bank address BA_RD<1:4>. The inverter IV116 may inversely buffer the datum of the first bit BA_RD<1> of the read bank address BA_RD<1:4> to output the inversely buffered datum to the node nd13.

The first write pipe 105 may store the signal of the node nd12 if the first write input control signal WPIN<1> is generated. The first write pipe 105 may output the stored signal to a node nd14 if the first write output control signal WPOUT<1> is generated. The first write pipe 105 may be realized using a pipe latch.

The second write pipe 106 may store the signal of the node nd12 if the second write input control signal WPIN<2> is generated. The second write pipe 106 may output the stored signal to the node nd14 if the second write output control signal WPOUT<2> is generated. The second write pipe 106 may be realized using a pipe latch.

The third write pipe 107 may store the signal of the node nd12 if the third write input control signal WPIN<3> is generated. The third write pipe 107 may output the stored signal to the node nd14 if the third write output control signal WPOUT<3> is generated. The third write pipe 107 may be realized using a pipe latch.

The fourth write pipe 108 may store the signal of the node nd12 if the fourth write input control signal WPIN<4> is generated. The fourth write pipe 108 may output the stored signal to the node nd14 if the fourth write output control signal WPOUT<4> is generated. The fourth write pipe 108 may be realized using a pipe latch.

The write bank address output circuit 109 may be configured to perform a driving operation and inversion operation, and may include, for example but not limited to, a PMOS transistor P112, an inverter IV117 and an inverter IV118. The PMOS transistor P112 may drive the node nd14 to the power supply voltage VDD if the initialization signal INTB is generated. The inverter IV117 may inversely buffer a signal of the node nd14 to output the inversely buffered signal as the first bit BA_WT<1> of the write bank address BA_WT<1:4>. The inverter IV118 may inversely buffer the datum of the first bit BA_WT<1> of the write bank address BA_WT<1:4> to output the inversely buffered datum to the node nd14.

The write operation of the semiconductor device 100 having an aforementioned configuration will be described hereinafter with reference to FIGS. 14 and 15. In such a case, it may be assumed that the semiconductor device 100 performs the write operation while the third state information C41_BG_BL32 is generated by setting a ratio of a frequency of the data clock signal WCK to a frequency of the clock signal CLK as four, by setting the column operation to be performed in the bank group mode, and by setting the burst length as thirty-two.

Figure 14:
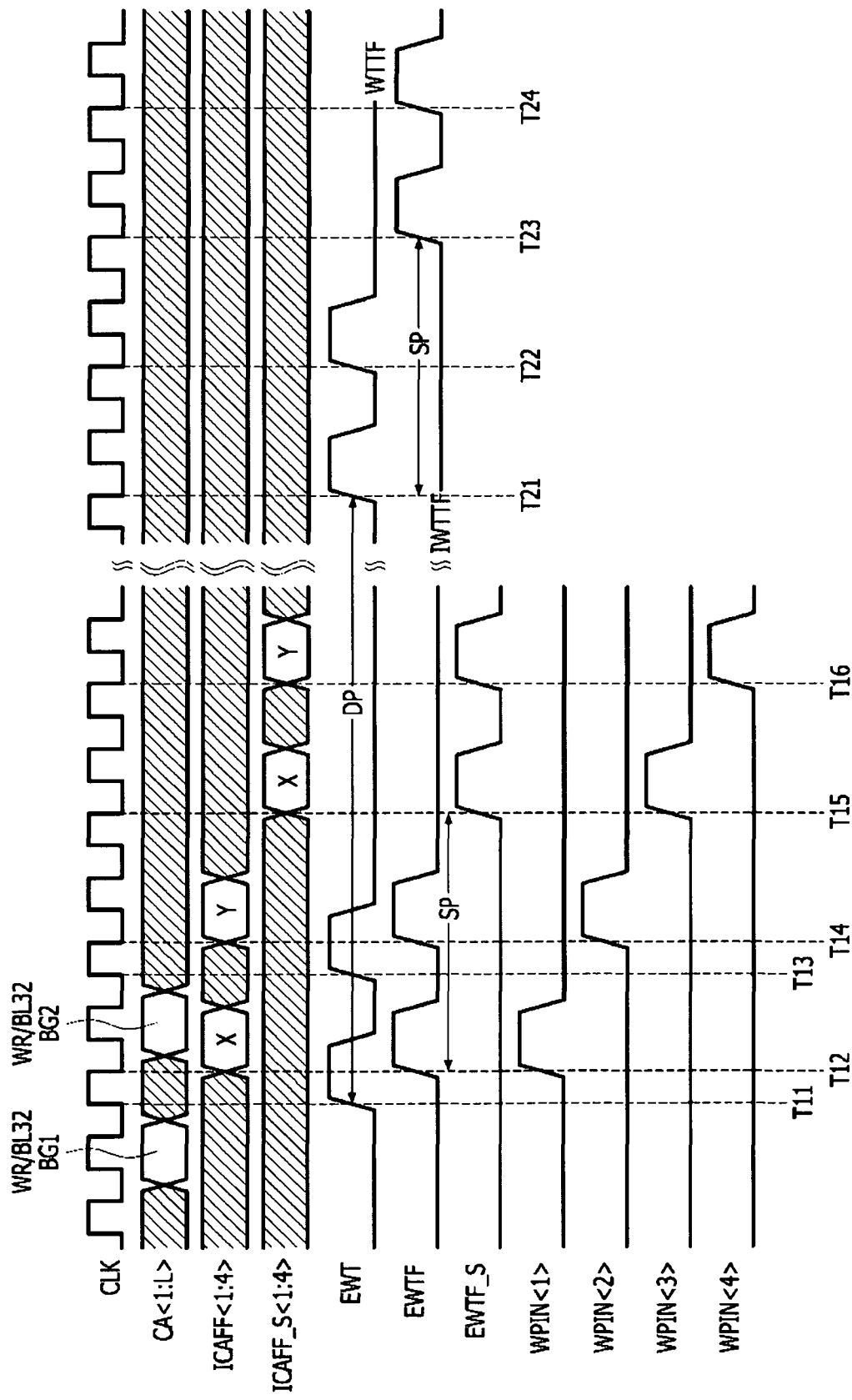
FIGS. 14 and 15 are timing diagrams illustrating operations of the semiconductor device described with reference to FIGS. 1 to 13.

As illustrated in FIG. 14, if a write command for a first bank group BG1 is inputted to the semiconductor device 100, a first pulse of the first write signal EWT may be generated in synchronization with a rising edge of the clock signal CLK at a point of time "T11" and a first pulse of the second write signal EWTF may be generated in synchronization with a falling edge of the clock signal CLK at a point of time "T12". If a write command for a second bank group BG2 is inputted to the semiconductor device 100, a second pulse of the first write signal EWT may be generated in synchronization with a rising edge of the clock signal CLK at a point of time "T13" and a second pulse of the second write signal EWTF may be generated in synchronization with a falling edge of the clock signal CLK at a point of time "T14". If the third state information C41_BG_BL32 is generated, the second mode signal MD<2> may be generated. Accordingly, the second write signal EWTF may be shifted by four cycles of the clock signal CLK, which is set as a shift period SP, to generate the shifted write signal EWTF_S including pulses respectively created at a point of time "T15" and a point of time "T16". Since the first write input control signal WPIN<1> is generated in synchronization with the first pulse of the second write signal EWTF created at the point of time "T12", the internal address ICAFF<1:4> corresponding to a first cell array X included in the first bank group BG1 may be latched and stored. Since the second write input control signal WPIN<2> is generated in synchronization with the second pulse of the second write signal EWTF created at the point of time "T14", the internal address ICAFF<1:4> corresponding to a second cell array Y included in the second bank group BG2 may be latched and stored. Since the third write input control signal WPIN<3> is generated in synchronization with the first pulse of the shifted write signal EWTF_S created at the point of time "T15", the shifted internal address ICAFF_S<1:4> corresponding to the first cell array X included in the first bank group BG1 may be latched and stored. Since the fourth write input control signal WPIN<4> is generated in synchronization with the second pulse of the shifted write signal EWTF_S created at the point of time "T16", the shifted internal address ICAFF_S<1:4> corresponding to the second cell array Y included in the second bank group BG2 may be latched and stored.

As illustrated in FIG. 14, the first write signal EWT may be delayed by a delay period DP, which is set according to a write latency, to generate the write flag WTTF including pulses respectively created at a point of time "T21" and a point of time "T22". While the second mode signal MD<2> is generated, the write flag WTTF may be shifted by four cycles of the clock signal CLK, which is set as the shift period SP, to generate the internal write flag IWTTF including pulses respectively created at a point of time "T23" and a point of time "T24".

Figure 15:
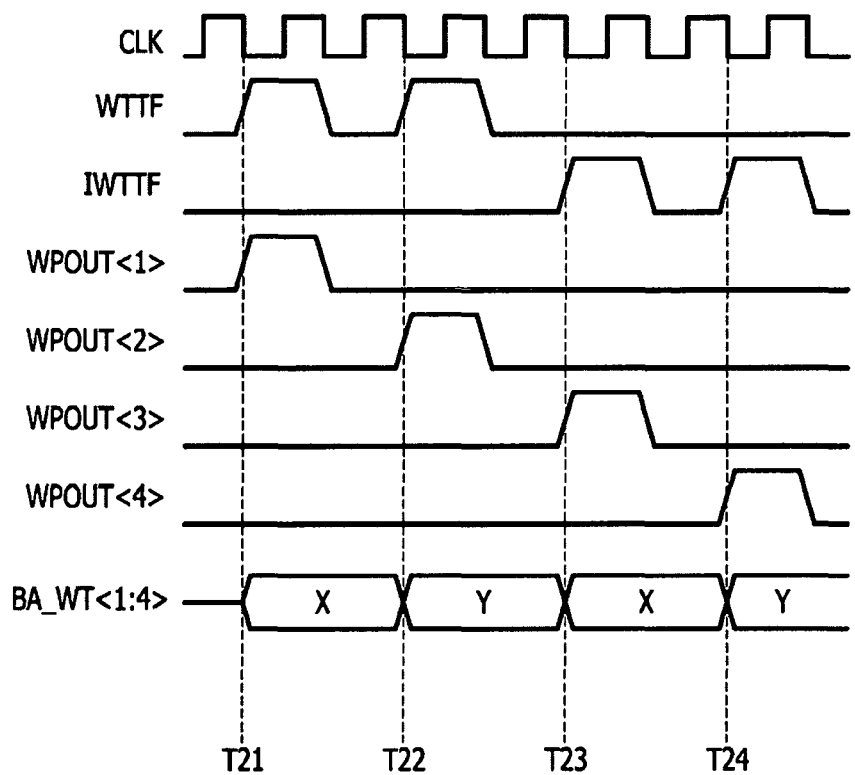

As illustrated in FIG. 15, the first write output control signal WPOUT<1> may be generated in synchronization with the first pulse of the write flag WTTF, which is created at the point of time "T21". The write bank address BA_WT<1:4> may be generated from the internal address ICAFF<1:4> corresponding to the first cell array X included in the first bank group BG1, which is latched and stored at the point of time "T12", in synchronization with the first write output control signal WPOUT<1> generated at the point of time "T21". A column operation for 16-bit data of the first cell array X included in the first bank group BG1 may be performed by the write bank address BA_WT<1:4> generated at the point of time "T21". The second write output control signal WPOUT<2> may be generated in synchronization with the second pulse of the write flag WTTF, which is created at the point of time "T22". The write bank address BA_WT<1:4> may be generated from the internal address ICAFF<1:4> corresponding to the second cell array Y included in the second bank group BG2, which is latched and stored at the point of time "T14", in synchronization with the second write output control signal WPOUT<2> generated at the point of time "T22". A column operation for 16-bit data of the second cell array Y included in the second bank group BG2 may be performed by the write bank address BA_WT<1:4> generated at the point of time "T22". The third write output control signal WPOUT<3> may be generated in synchronization with the first pulse of the internal write flag IWTTF, which is created at the point of time "T23". The write bank address BA_WT<1:4> may be generated from the shifted internal address ICAFF_S<1:4> corresponding to the first cell array X included in the first bank group BG1, which is latched and stored at the point of time "T15", in synchronization with the third write output control signal WPOUT<3> generated at the point of time "T23". A column operation for 16-bit data of the first cell array X included in the first bank group BG1 may be performed by the write bank address BA_WT<1:4> generated at the point of time "T23". The fourth write output control signal WPOUT<4> may be generated in synchronization with the second pulse of the internal write flag IWTTF, which is created at the point of time "T24". The write bank address BA_WT<1:4> may be generated from the shifted internal address ICAFF_S<1:4> corresponding to the second cell array Y included in the second bank group BG2, which is latched and stored at the point of time "T16", in synchronization with the fourth write output control signal WPOUT<4> generated at the point of time "T24". A column operation for 16-bit data of the second cell array Y included in the second bank group BG2 may be performed by the write bank address BA_WT<1:4> generated at the point of time "T24". A column operation for 32-bit data of the first cell array X included in the first bank group BG1 may be performed to include the column operation for 16-bit data performed during a period from the point of time "T21" till the point of time "T22" and the column operation for 16-bit data performed during a period from the point of time "T23" till the point of time "T24" after a bubble period corresponding to the period between the points of time "T22" and "T23" elapses. A column operation for 32-bit data of the second cell array Y included in the second bank group BG2 may be performed to include the column operation for 16-bit data performed during a period from the point of time "T22" till the point of time "T23" and the column operation for 16-bit data performed from the point of time "T24" after a bubble period corresponding to the period between the points of time "T23" and "T24" elapses.

As described above, a semiconductor device according to an embodiment may perform a column operation for 32-bit data including a bubble period by latching and storing the internal address ICAFF<1:4> in synchronization with the second write signal EWTF and by latching and storing the shifted internal address ICAFF_S<1:4> in synchronization with the shifted write signal EWTF_S while the burst length is set as thirty-two in the bank group mode. The column operation including the bubble period in the bank group mode may be performed using relatively simple circuits such as the pipe latches, thereby reducing a layout area of the semiconductor device. According to an embodiment, the column operation for 32-bit data of the semiconductor device may be achieved by sequentially performing two separate column operations for 16-bit data with the bubble period. Thus, it may be possible to perform a bank interleaving operation for the banks included in the first bank group BG1 and the banks included in the second bank group BG2.

Figure 16:
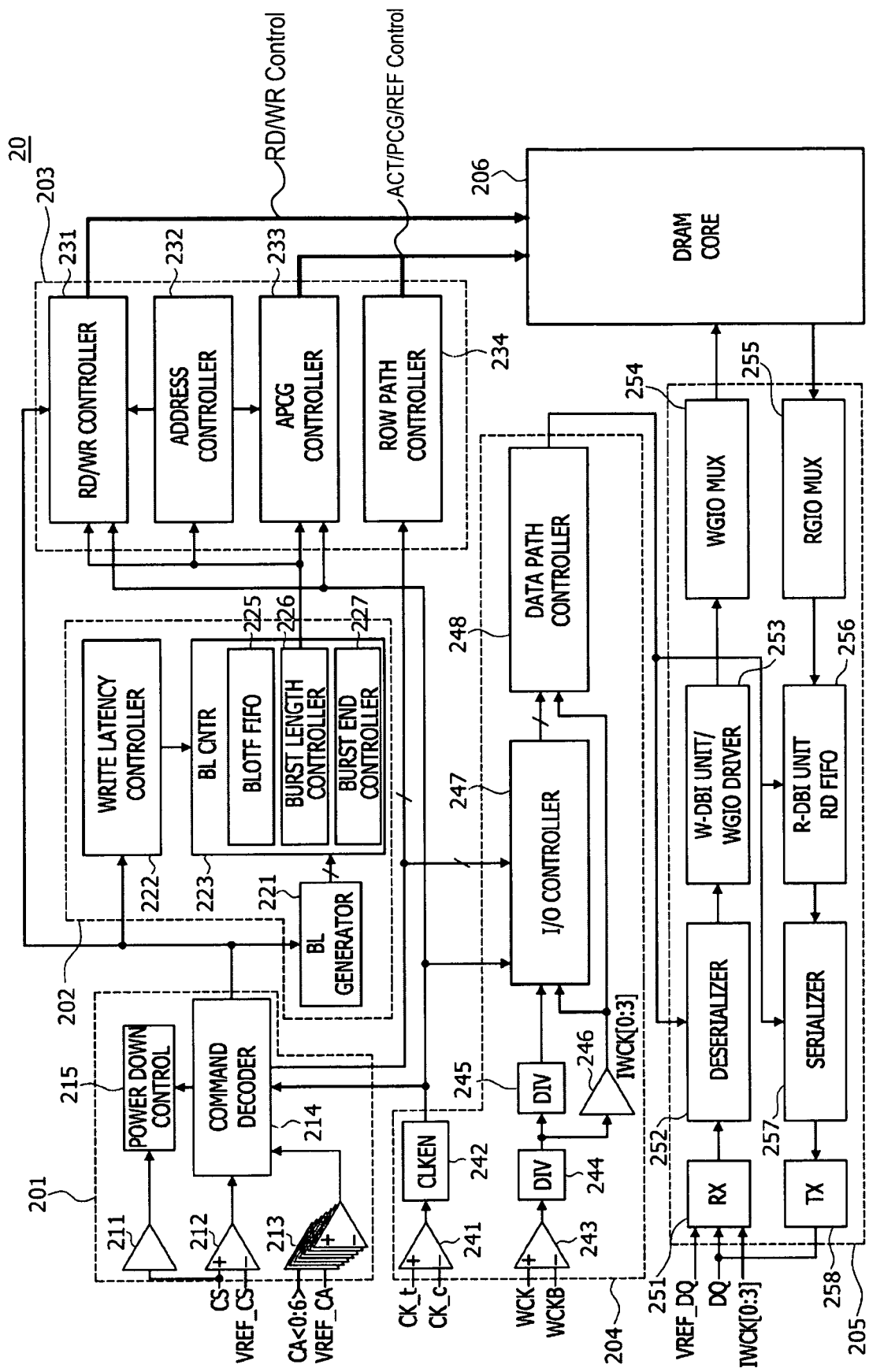
FIG. 16 is a block diagram illustrating a configuration of a semiconductor device according to an embodiment of the present disclosure.

Referring to FIG. 16, a semiconductor device 20 according to an embodiment may include a command control circuit 201, a latency/burst control circuit 202, an operation control circuit 203, an input/output (I/O) control circuit 204, a data I/O circuit 205 and a DRAM core 206.

The command control circuit 201 may include an input drive circuit 211, a chip selection signal buffer 212, a command/address buffer 213, a command decoder 214 and a power-down control circuit 215. The input drive circuit 211 may receive and drive a chip selection signal CS to transmit the chip selection signal CS to the power-down control circuit 215. The chip selection signal buffer 212 may buffer the chip selection signal CS based on a chip selection reference voltage VREF_CS. The command/address buffer 213 may buffer a command/address signal CA<0:6> based on a command/address reference voltage VREF_CA. The command decoder 214 may decode the command/address signal CA<0:6> buffered by the command/address buffer 213 based on the chip selection signal CS buffered by the chip selection signal buffer 212 to generate various commands for the operation of the semiconductor device 20. The power-down control circuit 215 may control a power-down mode based on the chip selection signal CS driven by the input drive circuit 211 and a command generated by the command decoder 214.

The latency/burst control circuit 202 may include a burst length information generator 221, a write latency controller 222 and a burst length control circuit 223. The burst length information generator 221 may generate information for control of a burst length operation based on a command generated by the command decoder 214. The write latency controller 222 may perform a control operation according to a write latency based on a command generated by the command decoder 214. The burst length control circuit 223 may include information storage circuit 225 storing information outputted from the burst length information generator 221. The burst length control circuit 223 may include a burst length controller 226 for controlling the burst length operation based on a command generated by the command decoder 214, a signal outputted from the write latency controller 222, and information outputted from the burst length information generator 221. The burst length control circuit 223 may include a burst end controller 227 for controlling a burst end operation based on a command generated by the command decoder 214, a signal outputted from the write latency controller 222, and information outputted from the burst length information generator 221.

The operation control circuit 203 may include a read/write controller 231, an address controller 232, an auto-pre-charge controller 233 and a row path controller 234 to generate a read/write control signal RD/WR_Control for controlling a read operation and a write operation as well as a row path control signal ACT/PCG/REF_Control for controlling an active operation, a pre-charge operation and a refresh operation. The read/write controller 231 may control the read operation and the write operation based on a signal outputted from the latency/burst control circuit 202 and a signal outputted from the address controller 232 if clock signals CK_t and CK_c are activated. The address controller 232 may control generation of an address based on a signal outputted from the latency/burst control circuit 202. The auto-pre-charge controller 233 may control an auto-pre-charge operation based on a signal outputted from the latency/burst control circuit 202 if the clock signals CK_t and CK_c are activated. The row path controller 234 may control a row path based on a command generated by the command decoder 214.

The I/O control circuit 204 may include a first clock buffer 241, a clock enablement signal generator 242, a second clock buffer 243, a first divider 244, a second divider 245, an internal clock driver 246, an I/O controller 247 and a data path controller 248. The first clock buffer 241 may receive and buffer the clock signals CK_t and CK_c. The clock enablement signal generator 242 may generate a clock enablement signal after the clock signals CK_t and CK_c buffered by the first clock buffer 241 are activated. The second clock buffer 243 may receive and buffer data clock signals WCK and WCKB for input and output of the data. The first divider 244 may divide the data clock signals WCK and WCKB buffered by the second clock buffer 243. The second divider 245 may receive and divide an output signal of the first divider 244. The internal clock driver 246 may receive and divide an output signal of the first divider 244 to generate an internal data clock signal IWCK[0:3]. The I/O controller 247 may receive a signal divided by the second divider 245 and the internal data clock signal IWCK[0:3] generated by the internal clock driver 246 to control the input and output of the data. The data path controller 248 may control a data path used in the input and output of the data based on a signal outputted from the I/O controller 247 and the internal data clock signal IWCK[0:3] generated by the internal clock driver 246.

The data I/O circuit 205 may include a receiver 251, a deserializer 252, a write driver 253, a write multiplexer 254, a read multiplexer 255, a read driver 256, a serializer 257 and a transmitter 258. The receiver 251 may be synchronized with the internal data clock signal IWCK[0:3] to receive transmission data DQ based on a data reference voltage VREF_DQ. The deserializer 252 may convert the transmission data DQ inputted in series through the receiver 251 into parallel data. The write driver 253 may drive the parallel data to transmit the drive parallel data to the write multiplexer 254. The write multiplexer 254 may transmit the data driven by the write driver 253 to the DRAM core 206 using a multiplexing method and an I/O line. The read multiplexer 255 may output the data outputted from the DRAM core 206 through the I/O line to the read driver 256 using a multiplexing method during the read operation. The read driver 256 may drive the data outputted from the DRAM core 206 through the read multiplexer 255 to output the driven data to the serializer 257. The serializer 257 may convert the data outputted from the read driver 256 into serial data. The transmitter 258 may output the serial data converted by the serializer 257 as the transmission data DQ.

The DRAM core 206 may perform the read operation or the write operation for outputting or receiving the data through the data I/O circuit 205 based on the read/write control signal RD/WR_Control. The DRAM core 206 may perform the active operation, the pre-charge operation or the refresh operation based on the row path control signal ACT/PCG/REF_Control.

What is claimed is:
1. A semiconductor device comprising:
   a shifted write signal generation circuit configured to shift a write signal in synchronization with a clock signal based on a mode signal to generate a shifted write signal;
   a shifted address generation circuit configured to shift in synchronization with the clock signal an internal address based on the mode signal to generate a shifted internal address; and a bank address latch circuit configured to latch and store the internal address based on the write signal, configured to latch and store the shifted internal address based on the shifted write signal, and configured to generate a write bank address from the stored internal address and the stored address of the shifted internal address.

2. The semiconductor device of claim 1, wherein the mode signal includes first to $N^{th}$ mode signals (where, "N" denotes a natural number which is equal to or greater than two); and
wherein one of the first to $N^{th}$ mode signals is selectively generated according to a ratio of a frequency of a data clock signal to a frequency of the clock signal, a bank mode in which a column operation is performed, and a burst length which is set for the column operation.

3. The semiconductor device of claim 1,
wherein the mode signal includes first to $N^{th}$ mode signals (where, "N" denotes a natural number which is equal to or greater than two); and
wherein the shifted write signal is generated by shifting the write signal by a period (multiple times a cycle of the clock signal) corresponding to one selectively generated among the first to $N^{th}$ mode signals.

4. The semiconductor device of claim 1,
wherein the mode signal includes first to $N^{th}$ mode signals (where, "N" denotes a natural number which is equal to or greater than two); and
wherein the shifted internal address is generated by shifting the internal address by a period (multiple times a cycle of the clock signal) corresponding to one selectively generated among the first to $N^{th}$ mode signals.

5. The semiconductor device of claim 1, wherein the bank address latch circuit is configured to store the latched internal address based on a write input control signal, configured to store the latched address of the shifted internal address based on the write input control signal, configured to generate the write bank address from the stored internal address based on a write output control signal, and configured to generate the write bank address from the stored address of the shifted internal address based on the write output control signal.

6. The semiconductor device of claim 5,
wherein the write input control signal is generated when the write signal or the shifted write signal is generated; and
wherein the write output control signal is generated when a write flag or an internal write flag is generated.

7. The semiconductor device of claim 6,
wherein the write flag is generated by delaying the write signal by a period corresponding to a write latency; and
wherein the internal write flag is generated by shifting the write flag based on the mode signal.

8. The semiconductor device of claim 1, further comprising a shifted read signal generation circuit configured to shift a read signal based on the mode signal to generate a shifted read signal.

9. The semiconductor device of claim 8, wherein the bank address latch circuit is configured to latch and store the internal address based on the read signal, configured to latch and store the shifted internal address based on the shifted read signal, and configured to generate a read bank address from the stored internal address and the stored address of the shifted internal address.

10. The semiconductor device of claim 9, wherein the bank address latch circuit is configured to generate the read bank address from the latched internal address based on a read control signal and configured to generate the read bank address from the latched address of the shifted internal address based on the read control signal.

11. The semiconductor device of claim 10, wherein the read control signal is generated at a point of time that a predetermined read delay period elapses from a point of time that the read signal or the shifted read signal is generated.

12. A semiconductor device comprising:
a shifted read signal generation circuit configured to shift a read signal in synchronization with a clock signal based on a mode signal to generate a shifted read signal;
a shifted address generation circuit configured to shift an internal address in synchronization with the clock signal based on the mode signal to generate a shifted internal address; and
a bank address latch circuit configured to latch and store the internal address based on the read signal, configured to latch and store the shifted internal address based on the shifted read signal, and configured to generate a read bank address from the stored internal address and the stored address of the shifted internal address.

13. The semiconductor device of claim 12, wherein the bank address latch circuit is configured to generate the read bank address from the latched internal address based on a read control signal and configured to generate the read bank address from the latched address of the shifted internal address based on the read control signal.

14. The semiconductor device of claim 13, wherein the read control signal is generated at a point of time that a predetermined read delay period elapses from a point of time that the read signal or the shifted read signal is generated.

15. A semiconductor device comprising:
a first internal address latch configured to latch an internal address based on a write signal;
a second internal address latch configured to latch a shifted internal address based on a shifted write signal; and
a pipe latch configured to store the internal address, which is latched by the first internal address latch, based on a write input control signal, configured to store the shifted internal address, which is latched by the second internal address latch, based on the write input control signal, configured to output the stored internal address based on a write output control signal for generation of a write bank address, and configured to output the stored address of the shifted internal address based on the write output control signal for generation of the write bank address, wherein the shifted write signal is generated by shifting the write signal in synchronization with a clock signal based on a mode signal.

16. The semiconductor device of claim 15,
wherein the shifted internal address is generated by shifting the internal address based on the mode signal.

17. The semiconductor device of claim 16,
wherein the mode signal includes first to $N^{th}$ mode signals (where, "N" denotes a natural number which is equal to or greater than two); and
wherein one of the first to $N^{th}$ mode signals is selectively generated according to a ratio of a frequency of the data clock signal to a frequency of the clock signal, a bank mode in which a column operation is performed, and a burst length which is set for the column operation.

18. The semiconductor device of claim 15,
wherein the write input control signal is generated when the write signal or the shifted write signal is generated; and wherein the write output control signal is generated when a write flag or an internal write flag is generated.

19. The semiconductor device of claim 15, further comprising:
   a third internal address latch configured to latch the internal address based on a read signal; and
   a fourth internal address latch configured to latch the shifted internal address based on a shifted read signal.

20. The semiconductor device of claim 19, further comprising an internal address buffer configured to buffer the latched internal address based on a read control signal for generation of a read bank address, and configured to buffer the latched address of the shifted internal address based on the read control signal for generation of the read bank address.

* * * * *